(12) United States Patent
Ohwada et al.

(10) Patent No.: US 9,431,067 B2
(45) Date of Patent: Aug. 30, 2016

(54) VOLATILE MEMORY BACKUP SYSTEM INCLUDING ALL-SOLID-STATE BATTERY

(71) Applicant: NGK Insulators, Ltd., Nagoya-Shi (JP)

(72) Inventors: Iwao Ohwada, Nagoya (JP); Kenshin Kitoh, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/921,426

(22) Filed: Oct. 23, 2015

(65) Prior Publication Data

US 2016/0071552 A1 Mar. 10, 2016

Related U.S. Application Data

(63) Continuation of application No. PCT/JP2015/061028, filed on Apr. 8, 2015.

(60) Provisional application No. 61/989,591, filed on May 7, 2014, provisional application No. 62/025,563, filed on Jul. 17, 2014, provisional application No. 62/048,941, filed on Sep. 11, 2014, provisional application No. 62/081,688, filed on Nov. 19, 2014.

(51) Int. Cl.
*G11C 5/14* (2006.01)
*G06F 12/16* (2006.01)
(Continued)

(52) U.S. Cl.
CPC .............. *G11C 5/141* (2013.01); *G06F 12/16* (2013.01); *G11C 11/401* (2013.01);
(Continued)

(58) Field of Classification Search
CPC .................................. G11C 5/14; G11C 5/141
USPC .................................................. 365/229, 228
See application file for complete search history.

(56) References Cited

U.S. PATENT DOCUMENTS 5,761,061 A * 6/1998 Amano ................. G11C 5/141
365/229
8,431,264 B2 4/2013 Neudecker et al.
(Continued)

FOREIGN PATENT DOCUMENTS

EP 1 603 026 A2 12/2005
JP 11-237934 A 8/1999
(Continued)

OTHER PUBLICATIONS

English translation of Written Opinion of the International Search Authority (PCT/ISA/237) (Application No. PCT/JP2015/061028) dated Apr. 4, 2016.
(Continued)

*Primary Examiner* — Son Mai
(74) *Attorney, Agent, or Firm* — Burr & Brown, PLLC

(57) ABSTRACT

The present invention provides a volatile memory backup system including an all-solid-state battery. The backup system includes a volatile memory, a nonvolatile memory connected to the volatile memory so as to transfer data therebetween, an all-solid-state battery connected to the volatile memory and the nonvolatile memory, the battery continuously or intermittently supplying a current to the volatile memory during a power failure to retain data in the volatile memory, and a controller connected in parallel with the battery, the controller intermittently supplying a peak current to the volatile memory during the power failure and intermittently transferring divided volumes of data in the volatile memory to the nonvolatile memory by the peak current and a current from the battery temporarily increased in association with the peak current to store the data in the nonvolatile memory, thereby gradually accumulating the data in the volatile memory into the nonvolatile memory.

34 Claims, 5 Drawing Sheets

(51) Int. Cl.

| | | |
|---|---|---|
| *G11C 11/401* | (2006.01) | |
| *H01M 4/131* | (2010.01) | |
| *H01M 10/052* | (2010.01) | |
| *H01M 10/0562* | (2010.01) | |
| *H01M 10/058* | (2010.01) | |
| *G11C 14/00* | (2006.01) | |
| *H01M 4/485* | (2010.01) | |
| *H01M 10/0525* | (2010.01) | |
| *H01M 10/0585* | (2010.01) | |

(52) U.S. Cl.
CPC ......... *G11C 14/0018* (2013.01); *H01M 4/131* (2013.01); *H01M 4/485* (2013.01); *H01M 10/052* (2013.01); *H01M 10/058* (2013.01); *H01M 10/0525* (2013.01); *H01M 10/0562* (2013.01); *H01M 10/0585* (2013.01); *H01M 2300/0068* (2013.01); *Y02E 60/122* (2013.01)

(56) References Cited

U.S. PATENT DOCUMENTS

| | | | |
|---|---|---|---|
| 2005/0283648 | A1 | 12/2005 | Ashmore |
| 2006/0072268 | A1* | 4/2006 | Kang ................. G06F 1/30 361/92 |
| 2010/0047696 | A1 | 2/2010 | Yoshida et al. |
| 2010/0159326 | A1 | 6/2010 | Sugiura et al. |
| 2011/0053000 | A1 | 3/2011 | Kanamura et al. |
| 2011/0053002 | A1 | 3/2011 | Yamamura et al. |
| 2012/0009470 | A1 | 1/2012 | Sugiura et al. |
| 2012/0009471 | A1 | 1/2012 | Sugiura et al. |
| 2012/0185187 | A1 | 7/2012 | Parakulam et al. |
| 2016/0065000 | A1* | 3/2016 | Maeda ................. G11C 5/144 307/23 |

FOREIGN PATENT DOCUMENTS

| | | |
|---|---|---|
| JP | 2009-086908 A | 4/2009 |
| JP | 2009-516359 A | 4/2009 |
| JP | 2011-051800 A | 3/2011 |
| JP | 2011-073962 A | 4/2011 |
| JP | 2011-073963 A | 4/2011 |
| JP | 4745463 B | 8/2011 |
| JP | 2012-009193 A | 1/2012 |
| JP | 2012-009194 A | 1/2012 |
| WO | 2007/061928 A2 | 5/2007 |
| WO | 2010/093356 A1 | 8/2010 |

OTHER PUBLICATIONS

International Search Report and Written Opinion (With English Translation), International Application No. PCT/JP2015/061028, dated Jun. 30, 2015 (11 pages).

Extended European Search Report (Application No. 15781842.8) dated Jun. 20, 2016.

* cited by examiner

US 9,431,067 B2

VOLATILE MEMORY BACKUP SYSTEM INCLUDING ALL-SOLID-STATE BATTERY

CROSS-REFERENCE TO RELATED APPLICATIONS

This application is a continuation application of PCT/JP2015/061028 filed Apr. 8, 2015, which claims priority to U.S. provisional application No. 61/989,591 filed May 7, 2014; U.S. provisional application No. 62/025,563 filed Jul. 17, 2014; U.S. provisional application No. 62/048,941 filed Sep. 11, 2014; and U.S. provisional application No. 62/081,688 filed Nov. 19, 2014, the entire contents all of which are incorporated herein by reference.

BACKGROUND OF THE INVENTION

1. Field of the Invention

The present invention relates to volatile memory backup systems including all-solid-state batteries.

2. Description of the Related Art

Volatile memories, such as DRAMs, are used as main memories of computers and servers. Especially DRAMs, which provide significantly high processing speed, have recently been used widely in computers and servers. At the same time, volatile memories, such as DRAMs, have such characteristics as to lose stored data when power supply is interrupted; thus, uninterruptible power systems (UPSs) or power generators (such as diesel power generators) are typically installed together with the volatile memories, for example, in the servers in mission-critical systems in preparation for power failures such as a power outage and an instantaneous voltage drop. Such precautionary measures facilitate smooth system restoration in the event of power failures. Unfortunately, since these devices are designed to supply power to the entire devices, such as servers, they should have a large scale and are typically installed separately from the devices, such as servers. Hard disk drives may be used as data storage for DRAMs; however, they take time (for example, several hours) to restore data to the DRAMs after the restoration of power supply.

Another type of DRAM is commercially available that includes a supercapacitor functioning as a small backup power source. Examples of the DRAMs provided with such supercapacitors are ArxCis-NV™ from Viking Technology and an NVDIMM from Micron Technology, Inc. Such a DRAM with a supercapacitor can transfer data stored in the DRAM to a nonvolatile memory (such as a NAND flash memory) using power temporarily supplied from the supercapacitor in the event of power failures such as a power outage and an instantaneous voltage drop and thus can retain the stored data in the nonvolatile memory after the stop of the power supply from the capacitor. After the power failure ends and then the power supply restarts, the stored data in the nonvolatile memory is restored into the DRAM, which enables prompt system restoration. Unfortunately, a supercapacitor (even if small) is too large to be mounted in a memory module, and has low heat resistance. The data in the DRAM is lost at the stop of power supply even within one minute, and thus it takes time (for example, several tens of seconds) to restore the data from the flash memory to the DRAM after the restoration of power supply.

A battery-backup DRAM has also been proposed that is a combination of a DRAM and a battery. At the stop of power supply, the battery-backup DRAM retains the data in the DRAM for a certain time by (1) switching the DRAM to a power-saving mode (for example, a self-refresh mode) specializing in data retention and (2) activating an emergency power source (for example, a lithium secondary battery) for retaining data in the DRAM. Unfortunately, the battery does not offer resistance to high temperature and has low energy density, so that the battery is difficult to be mounted in a memory module, and leads to loss of the data in the DRAM at the stop of power supply for a time over a designed back-up time.

The recent development of portable devices, such as personal computers and cellular phones, has been greatly expanding the demand for batteries as the power sources of the devices. Traditional batteries for such application contain liquid electrolytes (electrolytic solutions) containing flammable organic diluent solvents, as media for ion transfer. The battery containing such an electrolytic solution has a risk of the leakage of the electrolytic solution, ignition, explosion, or the like. To solve the problems, an all-solid-state battery has been developed that contains a solid electrolyte instead of a liquid electrolyte and consists of only solid components for ensuring the intrinsic safety. The all-solid-state battery, which contains a solid electrolyte, has a low risk of ignition, causes no liquid leakage, and barely causes a decline in the battery performance due to corrosion. The recent expansion of the application of batteries has been demanding smaller batteries with larger capacity. For example, such batteries include an all-solid-state battery that has a thick positive electrode and increased capacity. Patent Document 1 (U.S. Pat. No. 8,431,264) and Patent Document 2 (JP2009-516359A) each disclose an all-solid-state battery including a positive electrode having a thickness of more than approximately 4 µm and less than approximately 200 µm, a solid electrolyte having a thickness of less than approximately 10 µm, and a negative electrode having a thickness of less than approximately 30 µm. The positive electrodes disclosed in these documents apparently are composed of non-oriented positive-electrode active materials.

An oriented sintered plate made of lithium complex oxide has been proposed. For example, Patent Document 3 (JP2012-009193A) and Patent Document 4 (JP2012-009194A) each disclose a lithium-complex-oxide sintered plate having a layered rock-salt structure and having a diffraction intensity ratio [003]/[104] of 2 or less of the (003) plane to of the (104) plane in X-ray diffraction. Patent Document 5 (JP4745463B) discloses platy particles that are expressed by the general formula: $Li_p(Ni_x,Co_y,Al_z)O_2$ (where $0.9 \le p \le 1.3$, $0.6 < x < 0.9$, $0.1 < y < 0.3$, $0 \le z \le 0.2$, and $x+y+z=1$), that have a layered rock-salt structure, and in which the (003) plane is oriented so as to intersect the plate surface of the particle.

A garnet-type ceramic material having a $Li_7La_3Zr_2O_{12}$-based (LLZ-based) composition has received attention as a solid electrolyte having lithium-ion conductivity. For example, according to Patent Document 6 (JP2011-051800A), addition of Al to Li, La, and Zr, which are the basic elements of LLZ, improves denseness and lithium-ion conductivity.

According to Patent Document 7 (JP2011-073962A), addition of Nb and/or Ta to Li, La, and Zr, which are the basic elements of LLZ, further improves lithium-ion conductivity. Patent Document 8 (JP2011-073963A) discloses that a composition containing Li, La, Zr, and Al in a molar ratio of Li to La of 2.0 to 2.5 further improves denseness.

CITATION LIST

Patent Documents

[Patent Document 1] U.S. Pat. No. 8,431,264
[Patent Document 2] JP2009-516359A
[Patent Document 3] JP2012-009193A
[Patent Document 4] JP2012-009194A
[Patent Document 5] JP4745463B
[Patent Document 6] JP2011-051800A
[Patent Document 7] JP2011-073962A
[Patent Document 8] JP2011-073963A

SUMMARY OF THE INVENTION

An all-solid-state battery used as the above-described backup power source for a volatile memory is required to supply power as long as possible for preserving data in the event of power failures and thus to have large capacity and high energy density. The inventors have found that an all-solid-state battery exhibits a large capacity and a high energy density, and that these characteristics can be utilized to the utmost in the application for a backup power source for a volatile memory in a device, such as a computer and a server. The inventors also have found a method to retain the data in a volatile memory as long as possible in the event of power failures and instantaneously restore the data after the restoration of power supply and to prevent or minimize a risk of the data loss by intermittently and cumulatively copying the data into the nonvolatile memory in preparation for the energy depletion of the all-solid-state battery due to an unexpected delay in the restoration of power supply.

It is an object of the present invention to retain the data in a volatile memory as long as possible in the event of power failures and instantaneously restore the data after the restoration of power supply and to prevent or minimize a risk of the data loss by intermittently and cumulatively copying the data into the nonvolatile memory in preparation for the energy depletion of the all-solid-state battery due to an unexpected delay in the restoration of power supply.

In accordance with one embodiment of the present invention, there is provided a volatile memory backup system including an all-solid-state battery, comprising:

a volatile memory;

a nonvolatile memory connected to the volatile memory so as to transfer data therebetween;

an all-solid-state battery connected to the volatile memory and the nonvolatile memory, the all-solid-state battery continuously or intermittently supplying a current to the volatile memory in the event of a power failure to retain data in the volatile memory; and a controller connected in parallel with the all-solid-state battery, the controller intermittently supplying a peak current to the volatile memory in the event of the power failure and intermittently transferring divided volumes of data in the volatile memory to the nonvolatile memory by the peak current or by the peak current and a current from the all-solid-state battery temporarily increased in association with the peak current to store the data in the nonvolatile memory, thereby gradually accumulating the data in the volatile memory into the nonvolatile memory.

. 5 is an equivalent circuit diagram of the backup system in Example C3.

. 6 illustrates example waveforms of output from the backup power source in the backup system in Example C3.

DETAILED DESCRIPTION OF THE INVENTION

Volatile Memory Backup System

The present invention relates to a volatile memory backup system including an all-solid-state battery. This backup system includes a volatile memory, a nonvolatile memory, an all-solid-state battery, and a controller. The volatile memory and nonvolatile memory are connected to each other so as to transfer data therebetween. The all-solid-state battery is connected to the volatile memory and nonvolatile memory and continuously or intermittently supplies a current to the volatile memory in the event of a power failure to retain the data in the volatile memory. The controller is connected in parallel with the all-solid-state battery and intermittently supplies a peak current to the volatile memory in the event of the power failure. The controller intermittently transfers divided volumes of data in the volatile memory to the nonvolatile memory by the peak current or by the peak current and a current from the all-solid-state battery temporarily increased in association with the peak current and stores the data in the nonvolatile memory, thereby gradually accumulating the data in the volatile memory into the nonvolatile memory. This configuration can retain the data in the volatile memory as long as possible in the event of power failures and instantaneously restore the data after the restoration of power supply, and can prevent or minimize a risk of the data loss by intermittently and cumulatively copying the data into the nonvolatile memory in preparation for the decrease in output of the all-solid-state battery due to an unexpected delay in the restoration of power supply. The volatile memory is typically a DRAM, which will be used as an example in the following description; however, it should be noted that the volatile memory may be of any other type. The nonvolatile memory is typically a flash memory (such as a NAND flash memory), which will be used as an example in the following description; however, it should be noted that the nonvolatile memory may be of any other type.

Figure 1:
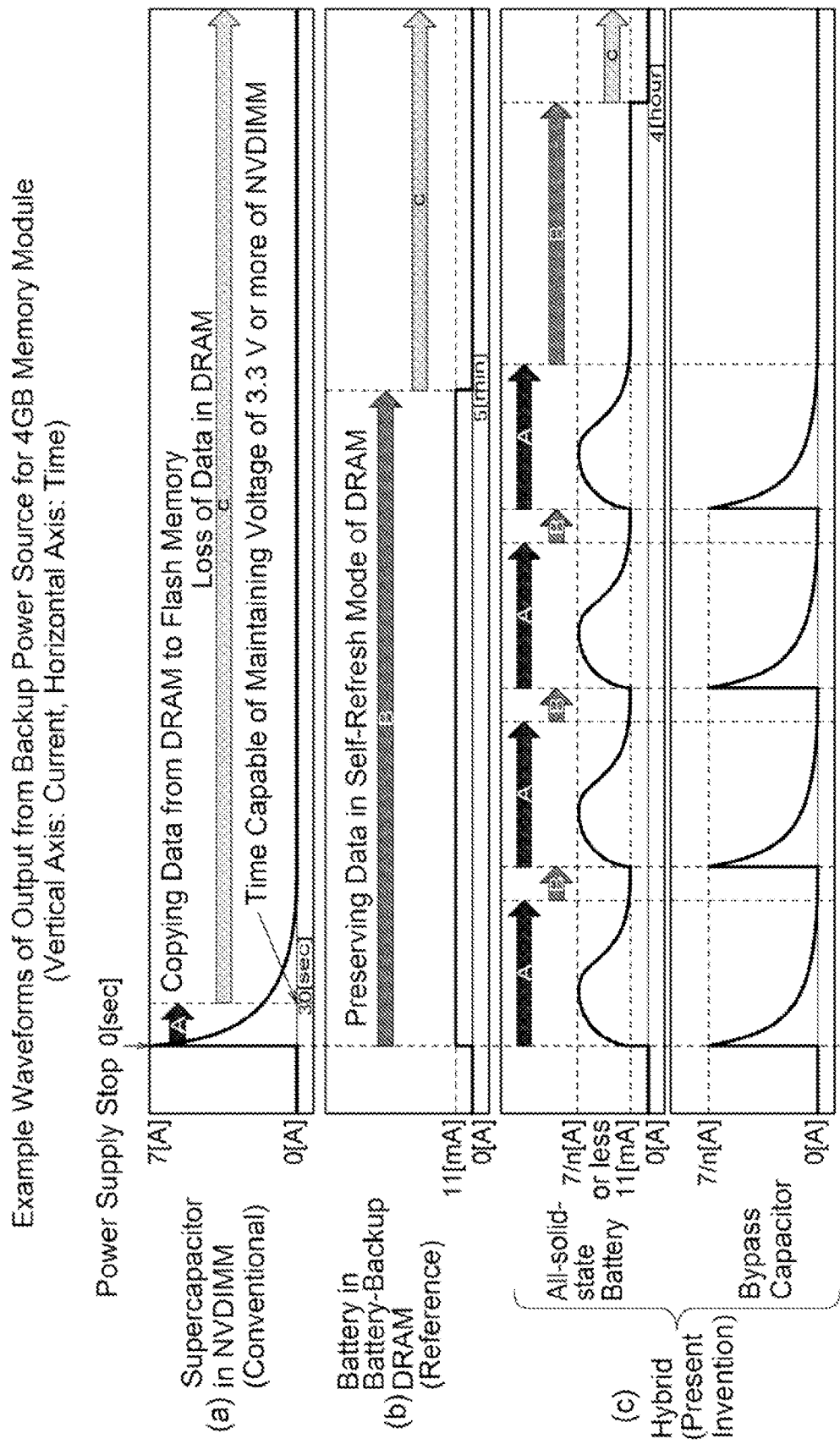
FIG. 1 illustrates example waveforms of output from various backup power sources for a 4 GB memory module. The vertical axis indicates current, and the horizontal axis indicates time. The portion (a) illustrates a conventional example in which a supercapacitor in an NVDIMM is used as a backup power source, and (b) illustrates a referential example in which a battery in a battery-backup DRAM is used as a backup power source. The portion (c) illustrates an example of the present invention including a hybrid backup power source including a combination of an all-solid-state battery and a bypass capacitor. In the drawing, "A" indicates that data is copied from a DRAM to a flash memory; "B" indicates that the DRAM retains the data in a self-refresh mode; and "C" indicates that the data in the DRAM is lost.

To describe the series of operations, FIG. 1 illustrates (c) an example waveform of power output from the hybrid backup system including a combination of the all-solid-state battery and a bypass capacitor as the controller in accordance with the present invention. To facilitate understanding, FIG. 1 also illustrates (a) an example waveform of power output from the supercapacitor in the above-described NVDIMM used as a backup power source and (b) an example waveform of power output from the battery in the above-described battery-backup DRAM used as a backup power source. The example waveforms of power output in FIG. 1 are all assumed to be for a 4 GB memory module, and the vertical axis corresponds to a current value, and the horizontal axis corresponds to time. All the conditions, such as current values, time and the waveforms, in FIG. 1 are exemplified for convenience of the description of the present invention, and should not be construed to limit the present invention. The advantages of the backup system exemplified in FIG. 1(c) in accordance with the present invention will be understood better in comparison with the power output waveforms of the backup systems shown in FIGS. 1(a) and (b). Thus, the power output waveforms in FIG. 1 will now be described in the order of (a), (b), and (c).

First, in the conventional example in which a supercapacitor in an NVDIMM is used as a backup power source shown in FIG. 1(a), the data in the DRAM is collectively copied into the flash memory in the time indicated by "A" in the drawing. In specific, a peak current (7 A in FIG. 1) is supplied from the supercapacitor at the same moment as the stop of power supply (which is the starting point (0 second) of the time), and the data is collectively copied from the DRAM as a volatile memory into the flash memory as a nonvolatile memory within a predetermined time (0 to 30 seconds in FIG. 1(a)). After the lapse of the predetermined time, the data in the DRAM is lost (See "C" in the drawing). The voltage of the NVDIMM can be maintained to be equal to or higher than a threshold (for example, 3.3 V) capable of transferring data to the flash memory in the time of copying the data, and it is desirable to complete the copy of all the data in the DRAM into the flash memory before the voltage drops below the threshold. (If not, data not copied from the DRAM to the flash memory is lost.) Thus, a large-capacity supercapacitor is used to supply a peak current high enough to collectively copy a large volume of data to the flash memory. Unfortunately, as described above, such a supercapacitor is too large to be mounted in a memory module, and has low heat resistance. The data in the DRAM is lost at the stop of power supply even within one minute, and thus it takes time (for example, several tens of seconds) to restore the data from the flash memory to the DRAM after the restoration of power supply.

Second, in the referential example in which a battery in a battery-backup DRAM is used as a backup power source in FIG. 1(b), the data in the DRAM is retained as it is in a relatively long time indicated by "B" in the drawing. This is because the DRAM operates in a power-saving mode (for example, a self-refresh mode) specializing in data retention, thus extending the life of the data in the DRAM. That is, the battery supplies the minimum current (for example, 11 mA) required for extending the life of the data in the DRAM to delay the depletion of the battery energy and waits for the restoration of power supply in the meantime. Unfortunately, if a conventional battery having low heat-resistant temperature and low energy density is used, the battery is difficult to be mounted in a memory module and the data in the DRAM will be lost at the stop of power supply for a time over a designed back-up time.

In contrast, with reference to FIG. 1(c), the backup system in accordance with one embodiment of the present invention includes a hybrid power source including a combination of an all-solid-state battery and a controller (provided with a bypass capacitor in the example in the drawing). In the hybrid power source, the controller provided with the bypass capacitor supplies a peak current intermittently (i.e., periodically) after the stop of power supply. The peak current from the bypass capacitor can apply a voltage equal to or higher than a threshold (for example, 3.3 V) capable of transferring data from the DRAM to the flash memory in the same manner as in FIG. 1(a), and additionally can be set significantly low at 1/n (7/n A in FIG. 1) of the peak current from the supercapacitor in FIG. 1(a) to copy the data in the DRAM to the flash memory at n different times (n is an integer of 2 or more, preferably 5 or more, more preferably 10 or more, and most preferably 100 or more). In specific, the time required for copying the data from the DRAM to the flash memory can be represented by a time constant τ of the CR series circuit composed of a static capacitance C of the DRAM cell from which data is copied and a resistor R including the flash memory connected to the DRAM memory cell in series, i.e., τ=CR, where τ is a constant determined by the specifications of the memory, and n division of C (the capacitance of the DRAM) corresponds to n multiplication of R, thus obtaining 1/n of the peak current. Since the controller (provided with the bypass capacitor in the example in the drawing) is connected in parallel with the all-solid-state battery, the all-solid-state battery supplies, to the DRAM, a current temporarily increased in association with the peak current from the controller with a small time lag in accordance with the electrochemical characteristics intrinsic to the all-solid-state battery. This phenomenon is explained by the function of the all-solid-state battery to compensate for charge lost at the controller (especially, the bypass capacitor) due to the generation of the peak current and to temporarily increase the current so as to follow the generation of the peak current. That is, the peak current supplied from the controller causes a temporary increase in the current supplied from the all-solid-state battery, thus ensuring sufficient time, indicated by "A" in the drawing, for copying divided volumes (i.e., 1/n) of data in the DRAM to the flash memory. In other words, a relatively large peak current is supplied instantaneously from the controller and thus attenuated immediately; however, another relatively large current is supplied from the all-solid-state battery with a slight delay to compensate for the attenuation, thus significantly increasing the length of the time indicated by "A" in the drawing in comparison with the capacitor alone in FIG. 1(a). In this way, divided volumes of data in the volatile memory is intermittently transferred to and stored in the nonvolatile memory by the peak current and the current from the all-solid-state battery temporarily increased in association with the peak current, and accordingly is accumulated gradually in the nonvolatile memory. This operation is repeated until all the data in the volatile memory is completely copied into the nonvolatile memory.

In a preferred embodiment in this time, the total sum of the peak current and the current from the all-solid-state battery temporarily increased in association with the peak current is attenuated periodically as indicated by "B" in FIG. 1(c), so that the data transfer from the volatile memory to the nonvolatile memory is intermittently suspended and the volatile memory operates in the power-saving mode using the current supplied from the all-solid-state battery in the meantime. Typical examples of such a power-saving mode include a self-refresh mode for retaining stored data (a mode for only maintaining data with minimum power) in the DRAM. This achieves the minimum power consumption of the all-solid-state battery and the longest possible retention (i.e., the life extension) of the data in the volatile memory, such as a DRAM. It is preferred that the current supply from the all-solid-state battery to the volatile memory continue until the restoration of power supply or the depletion of the battery energy even after all the data in the volatile memory is completely duplicated as indicated by "B" in FIG. 1(c) and that the data in the volatile memory be retained in the power-saving mode in the meantime. In either case, in the power-saving mode indicated by "B" in FIG. 1(c), the system is instantaneously restored only with the data in the volatile memory by properly monitoring a power-supply state without data backed up in the nonvolatile memory after the restoration of power supply.

In this way, the volatile memory backup system including the all-solid-state battery retains the data in the volatile memory as long as possible in the event of power failures, instantaneously restores the data after the restoration of power supply, and prevents or minimizes a risk of the data loss by intermittently and cumulatively copying the data into the nonvolatile memory in preparation for the depletion of the all-solid-state battery energy due to an unexpected delay in the restoration of power supply. Thus, the volatile memory and/or nonvolatile memory ensures the preservation of highly important data independently of a failure in an uninterruptible power system (UPS) or a power generator. If the data should be returned from the nonvolatile memory to the volatile memory, the system is restored on the second time scale by prompt data transfer therebetween, thus eliminating the data restoration from a hard disk drive, which requires a long time (for example, several hours). Since power only should be supplied to the volatile memory (such as a DRAM) and the nonvolatile memory in the device, instead of the entire device, such as a computer, the data is preserved with minimum required power. Accordingly, large devices, such as uninterruptible power systems (UPSs) and power generators, can be eliminated in some cases. It should be noted that multiple all-solid-state batteries may be provided in accordance with a required power supply time.

As described above, the controller should preferably include a bypass capacitor for supplying the peak current. The bypass capacitor has an advantage in that a higher peak current is supplied in a shorter time, over the all-solid-state battery. The bypass capacitor has a static capacitance 1/n that of a supercapacitor and thus can be mounted in or in the vicinity of a substrate (for example, a memory module) including a volatile memory and/or nonvolatile memory. The controller may supply the peak current from the parasitic capacitance of a circuit, component, and/or device connected with the backup system, and this configuration supplies a minute current but eliminates a bypass capacitor.

The all-solid-state battery used as the above-described backup power source for a volatile memory is required to supply power as long as possible for preserving data in the event of power failures and thus to have large capacity and high energy density. Unfortunately, all-solid-state batteries including non-oriented positive-electrode active materials, disclosed in Patent Documents 1 and 2, have thick positive electrode layers; however, their capacity and energy density do not increase as expected. The inventors have found that an all-solid-state battery including a positive electrode layer composed of thick oriented polycrystalline body exhibits a large capacity and a high energy density, and that these characteristics can be utilized to the utmost in the application for a backup power source for a volatile memory in a device, such as a computer and a server. Thus, the volatile memory backup system in accordance with the present invention can utilize the utmost advantages of the characteristics of the all-solid-state battery including an oriented polycrystalline positive-electrode active material, especially its small size, high energy density, and high-level safety.

Such an all-solid-state battery including an oriented polycrystalline positive-electrode active material will now be described.

Figure 2:
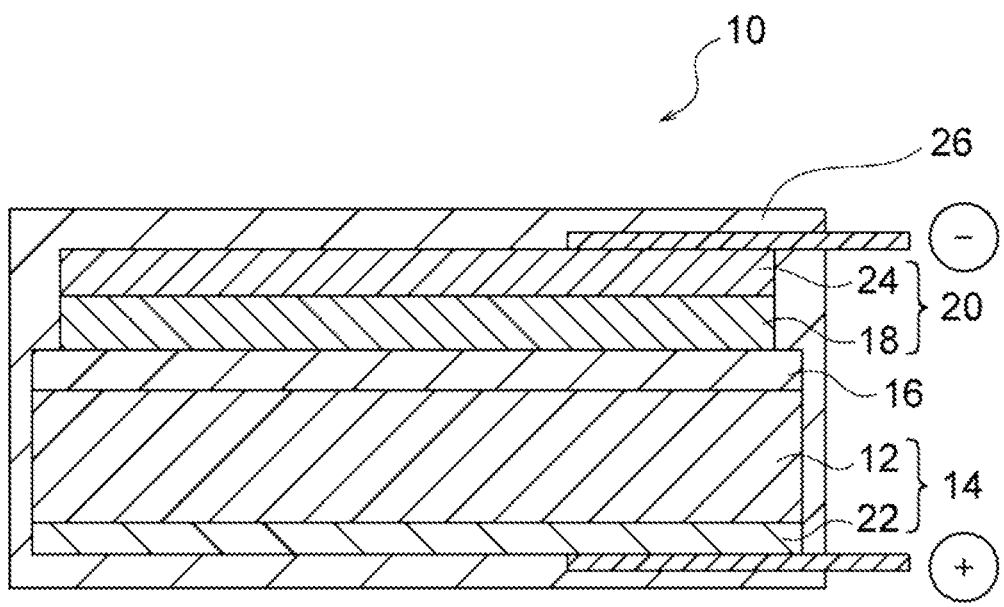
FIG. 2 is a schematic cross-sectional view of an example all-solid-state battery used in the present invention.

FIG. 2 schematically illustrates an example all-solid-state battery in accordance with a preferred embodiment of the present invention. The all-solid-state battery 10 in FIG. 2 includes a positive electrode layer 14 having a positive-electrode active material 12, a solid electrolyte layer 16 composed of a lithium-ion conductive material, and a negative electrode layer 20 having a negative-electrode active material 18, and the solid electrolyte layer 16 is disposed between the positive electrode layer 14 and the negative electrode layer 20. The positive-electrode active material 12 is an oriented polycrystalline body composed of lithium transition metal oxide grains oriented in a given direction. Although the all-solid-state batteries disclosed in Patent Documents 1 and 2 have thick positive electrode layers, their capacity and energy density do not increase as expected as described above. Since the positive-electrode active materials used for the positive electrode layers in Patent Documents 1 and 2 are not oriented, highly-efficient intercalation and deintercalation of lithium ions probably cannot occur over the entire thickness of the thick positive electrode layers. For example, lithium present at the side, of the thick positive electrode layer, away from the solid electrolyte may be insufficiently deintercalated. The positive-electrode active material 12 is an oriented polycrystalline body composed of lithium transition metal oxide grains oriented in a given direction; thus, even if the positive-electrode active material is thick, intercalation or deintercalation of lithium ions efficiently occurs over the entire thickness of the positive electrode layer, and the capacity is maximized due to the thick positive-electrode active material. For example, lithium present at the side, of the thick positive electrode layer, away from the solid electrolyte is sufficiently deintercalated. This improvement in capacity significantly increases the energy density of the all-solid-state battery. In sum, the all-solid-state battery in accordance with this embodiment exhibits a large capacity and a high energy density. Thus, a relatively thin or compact all-solid-state battery is provided that has large capacity, high energy density, and high-level safety.

For example, in a preferred embodiment of the present invention, the all-solid-state battery has an energy density of 700 Wh/L or higher, a thickness of 5 mm or less, and each of longitudinal and lateral dimensions of 100 mm or less. In another preferred embodiment of the present invention, the all-solid-state battery has an energy density of 600 Wh/L or higher, a thickness of 2 mm or less, and each of longitudinal and lateral dimensions of 50 mm or less. In still another preferred embodiment of the present invention, the all-solid-state battery has an energy density of 500 Wh/L or higher, a thickness of 1 mm or less, and each of longitudinal and lateral dimensions of 50 mm or less. In still another preferred embodiment of the present invention, the all-solid-state battery has an energy density of 250 Wh/L or higher, a thickness of 0.5 mm or less, and each of longitudinal and lateral dimensions of 50 mm or less. In still another preferred embodiment of the present invention, the all-solid-state battery has an energy density of 100 Wh/L or higher, a thickness of 0.3 mm or less, and each of longitudinal and lateral dimensions of 50 mm or less. Alternatively, in another preferred embodiment of the present invention, the all-solid-state battery has an energy density of 100 to 1,000 Wh/L, a thickness of 0.1 to 10 mm, and each of longitudinal and lateral dimensions of 5 to 100 mm, and more preferably an energy density of 250 to 700 Wh/L, a thickness of 0.3 to 5 mm, and each of longitudinal and lateral dimensions of 10 to 50 mm.

The relatively thin or compact all-solid-state battery 10 having large capacity and high energy density can be advantageously used in various fields that have rejected or have not anticipated practical application of conventional all-solid-state batteries. This is because the all-solid-state battery in this embodiment has various advantageous characteristics, such as high-level safety (due to the elimination of flammable electrolytic solutions), high weather resistance (operable at, for example, 80° C. or higher), and long service life (due to the elimination of electrolytic solutions, which deteriorate in hot environment) in addition to large capacity and high energy density (resulting in a reduction in thickness or height). An all-solid-state cell stack composed of such batteries as unit cells can provide a high-voltage battery.

Useful applications utilizing these advantageous characteristics to the utmost include the volatile memory backup system in accordance with the present invention. Preferably, the volatile memory backup system is installed in at least one device selected from the group consisting of a computer, a laptop computer, a portable computer, a pocket computer, a workstation, a supercomputer, computer-peripheral hardware, and a server. A commercially available DRAM provided with a capacitor includes a laminate of a DRAM-mounting substrate and a nonvolatile-memory-mounting substrate, and a capacitor connected with one another through long electric cables. This is because the DRAM reaches a significantly high temperature (for example, approximately 95° C.) during operation and thus the capacitor is desired to be disposed at a low-temperature position as distant from the DRAM and nonvolatile memory as possible in consideration of safety and reliability. The liquid battery and capacitor containing electrolytic solutions have a risk such as ignition or deterioration, if exposed to a high temperature of approximately 95° C. Moreover, the liquid battery and capacitor, which are significantly larger (especially thicker) than memory-mounting substrates, require long electric cables for their wiring, and thus extra space should be ensured in devices for accommodating the capacitor and long electric cables.

As described above, the all-solid-state battery in this embodiment has various advantageous characteristics, such as high-level safety (due to the elimination of flammable electrolytic solutions), high weather resistance (operable at, for example, 80° C. or higher), and long service life (due to the elimination of electrolytic solutions, which deteriorate in hot environment) in addition to large capacity and high energy density (resulting in a reduction in thickness or height). Thus, the all-solid-state battery in this embodiment safely and reliably functions even if exposed to a high temperature of approximately 95° C. and is suitably reduced in thickness or height, and thus can be disposed on or in the vicinity of (for example, adjacent to) the substrate where the memory, such as a DRAM, is mounted. For example, the all-solid-state battery in this embodiment may be affixed to the heat sink of the memory, such as a DRAM, or to part of the substrate so as not to overlap with the memory, such as a DRAM. This saves space, of course, and contributes to an improvement in performance as a backup battery by promptly supplying power from the all-solid-state battery with a small power loss in the event of power failures because the all-solid-state battery is close to the memory, such as a DRAM. Accordingly, the all-solid-state battery in this embodiment provides a very useful backup battery in a device, such as a computer, that is excellent in safety and reliability and suitable for space-saving at low cost.

As described above, the all-solid-state battery can be disposed in the vicinity of the volatile memory and non-volatile memory. For example, it is preferred that the volatile memory and nonvolatile memory be mounted on at least one substrate. In this case, the all-solid-state battery is preferably disposed on or in the vicinity of (for example, adjacent to) the substrate. The volatile memory and nonvolatile memory may be mounted on different substrates and these mounting substrates may be laminated in the form of a multilayer substrate, or the volatile memory and nonvolatile memory may be mounted on one substrate. The particularly preferable memory-mounting substrate is in the form of a memory module including an array of multiple volatile memories and/or multiple nonvolatile memories.

(1) Positive-electrode Active Material

The positive-electrode active material 12 is an oriented polycrystalline body composed of lithium transition metal oxide grains oriented in a given direction. The given direction is preferably the direction of lithium-ion conduction, and the positive-electrode active material 12 is typically a layer in which a specific crystal face of each grain is oriented in the direction from the positive electrode layer 14 toward the negative electrode layer 20.

The grains contained in the positive-electrode active material 12 are composed of lithium transition metal oxide. The lithium transition metal oxide preferably has a layered rock-salt structure or a spinel structure, more preferably a layered rock-salt structure. The layered rock-salt structure has such characteristics that the occlusion of lithium ions decreases the oxidation-reduction potential and the exclusion of lithium ions increases the oxidation-reduction potential, and a composition containing Ni in a large amount is particularly preferred. The layered rock-salt structure is a crystal structure including layers of transition metal other than lithium and lithium layers that are alternately stacked with oxygen-atom layers disposed therebetween, i.e., a crystal structure including layers of transition metal ions other than lithium and lithium-ion layers that are alternately stacked with oxide ions disposed therebetween (typically an $\alpha$-NaFeO$_2$-type structure of transition metal and lithium regularly arrayed in the [111] axis direction of a cubic rock-salt structure). Typical examples of lithium-transition metal complex oxide having a layered rock-salt structure include lithium nickelate, lithium manganate, lithium nickel manganate, lithium nickel cobaltate, lithium cobalt nickel manganate, and lithium cobalt manganate, and these materials may further contain one or more other elements, such as Mg, Al, Si, Ca, Ti, V, Cr, Fe, Cu, Zn, Ga, Ge, Sr, Y, Zr, Nb, Mo, Ag, Sn, Sb, Te, Ba, and Bi.

In specific, the lithium transition metal oxide preferably has a composition represented by $Li_xM1O_2$ or $Li_x(M1,M2)O_2$ where $0.5<x<1.10$, M1 is at least one transition metal element selected from the group consisting of Ni, Mn, and Co, and M2 is at least one element selected from the group consisting of Mg, Al, Si, Ca, Ti, V, Cr, Fe, Cu, Zn, Ga, Ge, Sr, Y, Zr, Nb, Mo, Ag, Sn, Sb, Te, Ba, and Bi; more preferably a composition represented by $Li_x(M1,M2)O_2$ where M1 is Ni and Co and M2 is at least one element selected from the group consisting of Mg, Al, and Zr; and most preferably a composition represented by $Li_x(M1,M2)O_2$ where M1 is Ni and Co and M2 is Al. Preferably, the atomic ratio of Ni to the total amount of M1 and M2 is 0.6 or more. These compositions can have layered rock-salt structures. Ceramics having a $Li_x(Ni,Co,Al)O_2$-based composition, where M1 are Ni and Co and M2 is Al, are called NCA ceramics in some cases. A particularly preferred NCA ceramic is represented by the general formula: $Li_p(Ni_x, Co_y, Al_z)O_2$ (where $0.9 \le p \le 1.3$, $0.6 < x \le 0.9$, $0.1 < y \le 0.3$, $0 \le z \le 0.2$, and $x+y+z=1$) and has a layered rock-salt structure. Also preferred are lithium transition metal oxides having a composition represented by $Li_xM1O_2$ where M1 is Ni, Mn, and Co or M1 is Co.

As described above, the positive-electrode active material 12 is an oriented polycrystalline body composed of lithium transition metal oxide grains. Preferably, the lithium transition metal oxide grains have a platy shape with a thickness of approximately 2 to 100 µm. More preferably, the specific crystal face is the (003) plane oriented in the direction from the positive electrode layer 14 toward the negative electrode layer 20. This can discharge a large number of lithium ions at the time of high input (charge) and can receive a large number of lithium ions at the time of high output (discharge) without preventing intercalation or deintercalation of lithium ions into or from the positive-electrode active material 12. Planes other than the (003) plane, for example, the (101) and (104) planes may be oriented along the plate surface of the positive-electrode active material 12. The details of the grains and oriented polycrystalline body are described in Patent Document 3 (JP2012-009193A), Patent Document 4 (JP2012-009194A), and Patent Document 5 (JP4745463B), the contents of which are incorporated herein by reference.

As described above, the oriented polycrystalline body of the positive-electrode active material 12 can be readily thickened compared to non-oriented polycrystalline bodies. In order to increase the amount of the active material per unit area, the oriented polycrystalline body preferably has a thickness of at least 5 pm, more preferably at least 10 µm, and most preferably at least 25 µm. The upper limit of the thickness is not particularly limited but may be practically 500 µm, more practically 200 µm, and most practically 100 µm.

Preferably, the positive-electrode active material 12 has a sheet shape. A preferred method of preparing the sheet positive-electrode active material (hereinafter referred to as a positive-electrode active material sheet) will be described later. The positive-electrode active material 12 may be composed of a single positive-electrode active material sheet or a laminate of several sheets prepared by division of a positive-electrode active material sheet.

(2) Solid Electrolyte Layer

The lithium-ion conductive material of the solid electrolyte layer 16 is preferably a garnet-based ceramic material, a nitride-based ceramic material, a perovskite-based ceramic material, a phosphate-based ceramic material, a sulfide-based ceramic material, or a polymer-based material, and more preferably at least one selected from the group consisting of a garnet-based ceramic material, a nitride-based ceramic material, a perovskite-based ceramic material, and a phosphate-based ceramic material. Examples of the garnet-based ceramic material include a Li—La—Zr—O-based material (in specific, $Li_7La_3Zr_2O_{12}$), a Li—La—Ta—O-based material (in specific, $Li_7La_3Ta_2O_{12}$), and the garnet-based ceramic material may be the materials described in Patent Document 6 (JP2011-051800A), Patent Document 7 (JP2011-073962A), and Patent Document 8 (JP2011-073963A), the contents of which are incorporated herein by reference. Examples of the nitride-based ceramic material include $Li_3N$. Examples of the perovskite-based ceramic material include Li—La—Zr—O-based materials (in specific, $LiLa_{1-x}Ti_xO_3$ ($0.04 \le x \le 0.14$)). Examples of the phosphate-based ceramic material include lithium phosphate, nitrogen-doped lithium phosphate (LiPON), Li—Al—Ti—P—O, Li—Al—Ge—P—O, and Li—Al—Ti—Si—P—O (in specific, $Li_{1+x+y}Al_xTi_{2+x}Si_yP_{3-y}O_{12}$ ($0 \le x \le 0.4$ and $0 < y \le 0.6$)).

The particularly preferable lithium-ion conductive material is a garnet-based ceramic material, which does not react with lithium in the negative electrode even after direct contact. More preferred materials are sintered oxides having a garnet-type or pseudo-garnet-type crystal structure containing Li, La, Zr, and O because the structure has excellent sintering properties, is readily densified, and has high ion conductivity. The garnet-type or pseudo-garnet-type crystal structure having such a composition is called an LLZ crystal structure and has an XRD pattern similar to that in X-ray diffraction file No. 422259 ($Li_7La_3Zr_2O_{12}$) in Cambridge Structural Database (CSD). The structure may have constituent elements different from that in No. 422259 and may have a Li content in the ceramic different from that in No. 422259, and thus may have a diffraction angle and diffraction intensity profile different from that in No. 422259. Preferably, the molar ratio Li/La of Li to La is 2.0 or more and 2.5 or less, and the molar ratio Zr/La of Zr to La is 0.5 or more and 0.67 or less. The garnet-type or pseudo-garnet-type crystal structure may further contain Nb and/or Ta. That is, partial replacement of Zr in LLZ with Nb and/or Ta improves conductivity in comparison to before the replacement. Preferably, Zr is replaced with Nb and/or Ta such that the molar ratio (Nb+Ta)/La is 0.03 or more and 0.20 or less. It is preferred that the garnet-based sintered oxide further contain Al, and these elements may be present in the crystal lattice or at positions other than the crystal lattice. Preferably, Al is added in an amount of 0.01 to 1 mass % of the sintered oxide, and the molar ratio Al/La of Al to La is 0.008 to 0.12. Such an LLZ-based ceramic is prepared according to or by appropriately modifying a known process described in Patent Document 6 (JP2011-051800A), Patent Document 7 (JP2011-073962A), and Patent Document 8 (JP2011-073963A), the contents of which are incorporated herein by reference.

Another particularly preferable lithium-ion conductive material is a phosphate-based ceramic material, more preferably nitrogen-doped lithium phosphate (LiPON).

The solid electrolyte layer 16 may have any size; and its thickness is preferably 0.0005 to 0.5 mm, more preferably 0.001 to 0.2 mm, and most preferably 0.005 to 0.1 mm, in view of charge-discharge rate characteristics and mechanical strength.

The solid electrolyte layer 16 may be formed by a particle jet coating process, a solid phase process, a solution process, a gas phase process, or a direct bonding process. Examples of the particle jet coating process include aerosol deposition (AD), gas deposition (GD), powder jet deposition (PJD), cold spraying (CS), and flame coating. The aerosol deposition (AD) is particularly preferred because it can be carried out at room temperature, thus preventing a variation in a composition during the process and formation of a high-resistance layer due to reaction with a positive-electrode plate. Examples of the solid phase process include tape lamination processes and printing processes. Tape lamination processes are preferred because they can form a thin solid electrolyte layer 16 and facilitate the thickness control. Examples of the solution process include hydrothermal synthesis, sol-gel processes, precipitation processes, microemulsion processes, and solvent evaporation processes. Hydrothermal synthesis is particularly preferred among these processes because it can readily yield highly crystalline crystal grains at low temperature. Microcrystals synthesized by these processes may be deposited or directly precipitated on the positive electrode. Examples of the gas phase process include laser deposition (PLD), sputtering, evaporation-condensation (PVD), chemical vapor deposition (CVD), vacuum deposition, and molecular beam epitaxy (MBE). The laser deposition (PLD) is particularly preferred because it causes a small variation in a composition and readily yields a relatively high-crystalline film. Direct bonding chemically activates the surfaces of a preliminarily formed solid electrolyte layer 16 and positive-electrode active material 12 and bonds the surfaces to each other at low temperature. The interface may be activated with plasma or by chemical modification with functional groups, such as hydroxyl groups.

(3) Negative-electrode Active Material

The negative-electrode active material 18 may be known negative-electrode active materials that can be used in all-solid-state lithium batteries. Preferred examples of the negative-electrode active material 18 include lithium metal, lithium alloy, carbonaceous materials, and lithium titanate (LTO). Preferably, the negative-electrode active material 18 is prepared by forming a thin film of lithium metal or an alloy of lithium metal and any other metal on a negative-electrode collector 24 (for example, copper foil) by vacuum deposition, sputtering, CVD, or the like.

(4) Collector

Preferably, the positive electrode layer 14 includes the positive-electrode active material 12 and a positive-electrode collector 22 disposed on a face, remote from the solid electrolyte layer 16, of the positive-electrode active material 12. Preferably, the negative electrode layer 20 includes the negative-electrode active material 18 and the negative-electrode collector 24 disposed on a face, remote from the solid electrolyte layer 16, of the negative-electrode active material 18. Examples of the materials of the positive-electrode collector 22 and negative-electrode collector 24 include platinum (Pt), platinum (Pt)/palladium (Pd), gold (Au), silver (Ag), aluminum (Al), copper (Cu), and an indium-tin oxide (ITO) film.

(5) Casing

Any casing 26 can be used that can accommodate a unit cell or a stack of multiple unit cells stacked in series or parallel. Since the all-solid-state battery 10 has no concern about leakage of an electrolytic solution, the casing 26 may have a relatively simple form. For example, the casing may be in the form of a chip to be mounted in an electronic circuit or a laminate cell in the application for thin, wide space (for example, a multi-layer aluminum (Al)/polypropylene (PP) composite sheet).

Production of Positive-Electrode Active Material Sheet

A preferred method of preparing the positive-electrode active material sheet will now be described.

(1) Preparation of Base Particles

The base particles are prepared by appropriately mixing particles of compounds containing, for example, Li, Co, Ni, and Mn, such that the positive-electrode active material has a composition $LiMO_2$ after synthesis and a layered rock-salt structure. Alternatively, the base particles may have a composition $LiMO_2$ (may be already synthesized).

Alternatively, as necessary, the base particles may be prepared by mixing particles of compounds, other than lithium compounds, containing, for example, Co, Ni, and Mn or may have a composition $(Co,Ni,Mn)O_x$. In this case, after the firing process of a green body, the fired body is further reacted with a lithium compound to yield $LiMO_2$.

To promote the grain growth and to compensate for the volatilized component during the firing process, a lithium compound may be added in an excess amount of 0.5 to 30 mol %. To promote the grain growth, low-melting oxide, such as bismuth oxide, or low-melting glass, such as borosilicate glass, may be added in an amount of 0.001 to 30 wt %.

(2) Base-Particle Shaping Process

The base particles are formed into a sheet-like self-supporting green body. Typically, the "self-supporting green body" maintains its shape as a sheet by itself. However, the "self-supporting green body" also includes a green body that cannot maintain its shape as a sheet by itself but is affixed or deposited on a substrate and then peeled from the substrate before or after firing.

The green body may be formed, for example, by a doctor blade process that uses slurry containing the base particles. Alternatively, the process of forming the green body may be performed with a drum dryer, with which base-material-containing slurry is applied onto a heated drum to be dried thereon, and the dried product is scraped off with a scraper. A disc dryer may be used, with which the slurry is applied onto a heated disk surface to be dried thereon, and the dried product is scraped off with a scraper in the process of forming the green body. Hollow granules produced under properly determined conditions of the spray dryer are regarded as a curved sheet-like green body and thus may be suitably used as a green body. The green body may be formed by an extrusion molding process that uses a slurry mixture containing the base particles.

In the doctor blade process, the green body of the platy polycrystalline particles before firing may be prepared by applying slurry onto a flexible plate (for example, an organic polymer plate, such as a PET film), drying and solidifying the applied slurry in the form of a green body, and peeling the green body from the plate. In the preparation of the slurry or slurry mixture before shaping, inorganic particles may be dispersed in an appropriate dispersion medium, and a binder or plasticizer may be added if needed. Preferably, the slurry is prepared so as to have a viscosity of 500 to 4000 cP and is defoamed under a reduced pressure.

(3) Firing Process of Green Body

In this firing process, the green body produced in the shaping process is placed on a setter and fired, for example, in the state as it is shaped (the sheet state). Alternatively, in the firing process, the sheet-like green body may be properly cut or pulverized and then fired in a sagger.

The mixed particles before synthesis, if used as the base particles, result in sintering and grain growth in addition to synthesis in this firing process. In the present invention, the green body has a sheet shape, which limits grain growth in the thickness direction. Thus, after the grain growth into one crystal grain in the thickness direction of the green body, the grain growth proceeds only in the in-plane direction of the green body. At this time, the specific energy-stable crystal face spreads over the sheet surface (plate surface). In this way, a film-like sheet (self-supporting film) is produced in which the specific crystal face is oriented in parallel with the sheet surface (plate surface).

If the base particles are $LiMO_2$, the crystal faces favorable for the intercalation and deintercalation of lithium ions, i.e., the (101) and (104) planes, are oriented so as to be exposed to the sheet surface (plate surface). If the base particles do not contain lithium (for example, $M_3O_4$ having a spinel structure), the (h00) plane, which will be the (104) plane after the reaction with a lithium compound to yield $LiMO_2$, is oriented so as to be exposed to the sheet surface (plate surface).

The firing temperature is preferably in the range of 800 to 1350° C. A temperature lower than 800° C. causes insufficient grain growth and a low degree of orientation. A temperature higher than 1350° C. accelerates decomposition and volatilization. The firing time is preferably 1 to 50 hours. A time less than one hour causes a low degree of orientation. A time exceeding 50 hours consumes excess energy. The firing atmosphere is properly determined so as to prevent decomposition during the firing. If lithium volatilization proceeds, it is preferred to dispose, for example, lithium carbonate in the same sagger to keep a lithium atmosphere. If oxygen release and further reduction proceed during the firing, it is preferred to fire the green body in an atmosphere under a high oxygen partial pressure.

If the sheet oriented by the firing is produced from the base particles not containing lithium compounds, the sheet is allowed to react with a lithium compound (such as lithium nitrate and lithium carbonate) to produce a positive-electrode active material film in which the crystal faces favorable for the intercalation and deintercalation of lithium ions are oriented so as to be exposed to the plate surface. For example, lithium nitrate is sprinkled over the oriented sheet, such that the molar ratio Li/M of Li to M is 1 or more, and the sheet is heat-treated to incorporate lithium. The heat-treatment temperature is preferably in the range of 600 to 800° C. A temperature lower than 600° C. causes insufficient reaction. A temperature higher than 800° C. causes a low degree of orientation.

(a) Positive-Electrode Active Material Sheet Containing $LiCoO_2$ Grains

The positive-electrode active material sheet containing $LiCoO_2$ grains is prepared, for example, by the following process. A green sheet is formed that contains $Co_3O_4$ and $Bi_2O_3$. The green sheet is fired at a temperature in the range of 900 to 1300° C. for a predetermined time to form an independent film-like sheet (self-supporting film) composed of a large number of platy $Co_3O_4$ grains (h00)-oriented in the direction of the plate surfaces of the grains. The term "(h00)-orientated" indicates that the (h00) plane is oriented in parallel with the plate surface. During the firing, bismuth is removed from the sheet by volatilization, and $Co_3O_4$ is converted into CoO by reduction. The "independent" sheet (self-supporting film) indicates a sheet that can be handled alone separately from a support after the firing. That is, the "independent" sheet does not include a sheet fixed to and integrated with (nor readily separable from) a support (such as a substrate) by the firing. In such a green sheet formed in a thin film (self-supporting film), the amount of materials present in the thickness direction is significantly smaller than that in the grain plate-surface direction, i.e., the in-plane direction (the direction orthogonal to the thickness). Thus, in the early stage, multiple grains are present in the thickness direction, and the grain growth occurs in a random direction. After the grain growth proceeds and the materials in the thickness direction are consumed, the grain growth is limited to the in-plane, i.e., two-dimensional direction. This ensures the promotion of the grain growth in the surface direction. Even in a relatively thick green sheet having a thickness of approximately 100 μm or more, the grain growth in the surface direction is ensured by promoting the grain growth as high as possible. At this time, the grain growth occurs selectively only in grains having the crystal face with the lowest surface energy in the plane of the green sheet, in a flat (platy) manner in the in-plane direction. Consequently, the sheet firing yields platy crystalline grains that have a high aspect ratio and the specific crystal face (the (h00) plane in this case) oriented in the grain plate-surface direction and that are composed of CoO. Then, CoO is oxidized to $Co_3O_4$ as the temperature decreases. At this time, the orientation of CoO is inherited, thus producing $Co_3O_4$ platy crystalline grains having the specific crystal face (the (h00) plane in this case) oriented in the grain plate-surface direction. The degree of orientation readily decreases during the oxidization from CoO to $Co_3O_4$. This is because a large difference in crystal structure and interatomic distance of Co-O between CoO and $Co_3O_4$ readily disturbs the crystal structure during the oxidization, i.e., the intercalation of oxygen atoms. Thus, it is preferred to appropriately select such conditions as to maintain the degree of orientation as high as possible. For example, it is preferred to reduce the cooling rate, to maintain the green sheet at a predetermined temperature, and to decrease the oxygen partial pressure. The green sheet is fired to produce a thin film (self-supporting film) in which a large number of flaky grains having the specific crystal face oriented in the grain plate-surface direction are bonded to each other at grain boundaries in the surface direction. That is, a thin film (self-supporting film) is formed that substantially has one crystalline grain in the thickness direction. It should be noted that "a thin film that substantially has one crystalline grain in the thickness direction" does not exclude a film that has portions (for example, ends) of crystalline grains adjacent to each other in the surface direction overlapping each other in the thickness direction. The self-supporting film can be a dense ceramic sheet containing a large number of flaky grains closely bonded to each other, as described above. The (h00)-oriented $Co_3O_4$ ceramic sheet produced in the above-described process is mixed with $Li_2CO_3$, and the mixture is then heated for a predetermined time, thereby introducing lithium into the $Co_3O_4$ grains. This provides a film-like sheet for the positive-electrode active material 12 with the (003) plane oriented in the direction from the positive electrode layer 14 toward the negative electrode layer 20 and the (104) plane oriented along the plate surface.

(b) Positive-Electrode Active Material Sheet Containing $Li_p(Ni_x,Co_y,Al_z)O_2$ Grains The positive-electrode active material sheet containing $Li_p(Ni_x,Co_y,Al_z)O_2$ grains is prepared, for example, by the following process. A green sheet containing NiO powder, $Co_3O_4$ powder, and $Al_2O_3$ powder is formed and then fired at a temperature in the range of 1000 to 1400° C. in the atmosphere for a predetermined time to form an independent film-like sheet (self-supporting film) composed of a large number of (h00)-oriented platy (Ni,Co,Al)O grains. An agent, such as $MnO_2$ and ZnO, can be added to promote the grain growth and thus to increase the degree of (h00)-orientation of the platy crystalline grains. The "independent" sheet indicates a sheet that can be handled alone separately from a support after the firing. That is, the "independent" sheet does not include a sheet fixed to and integrated with (nor readily separable from) a support (such as a substrate) by firing. In such a green sheet formed into a self-supporting film, the amount of materials present in the thickness direction is significantly smaller than that in the plate-surface direction, i.e., the in-plane direction (the direction orthogonal to the thickness). Thus, in the early stage, multiple grains are present in the thickness direction, and the grain growth occurs in a random direction. After the grain growth proceeds and the materials in the thickness direction are consumed, the grain growth is limited to the in-plane, i.e., two-dimensional direction. This ensures the promotion of the grain growth in the surface direction. Even in a relatively thick green sheet having a thickness of approximately 100 μm or more, the grain growth in the surface direction is ensured by promoting the grain growth as high as possible.

That is, the surface-directional grain growth is promoted preferentially in grains having the low-surface-energy face parallel to the plate surface direction, i.e., the in-plane direction (the direction orthogonal to the thickness). The green sheet formed into a film is fired to produce a self-supporting film in which a large number of flaky grains having the specific crystal face oriented in parallel with the grain plate surfaces are bonded to each other at grain boundaries in the surface direction. That is, a self-supporting film is formed that substantially has one crystalline grain in the thickness direction. It should be noted that "a self-supporting film that substantially has one crystalline grain in the thickness direction" does not exclude a film that has portions (for example, ends) of crystalline grains adjacent to each other in the surface direction overlapping each other in the thickness direction. The self-supporting film can be a dense ceramic sheet containing a large number of flaky grains closely bonded to each other, as described above. The (h00)-oriented (Ni,Co,Al)O ceramic sheet produced in the above-described process is mixed with lithium nitrate ($LiNO_3$), and the mixture is then heated for a predetermined time, thereby introducing lithium into the (Ni,Co,Al)O grains. This provides a film-like $Li(Ni_{0.75}Co_{0.2}Al_{0.05})O_2$ sheet for the positive-electrode active material 12 with the (003) plane oriented in the direction from the positive electrode layer 14 toward the negative electrode layer 20 and the (104) plane oriented along the plate surface.

Production of Lithium-ion Conductive Material

A preferred method of preparing an Al-containing LLZ ceramic sintered body, which is a typical lithium-ion conductive material of the solid electrolyte layer 16, will now be described.

In the first firing process, a raw material containing a Li component, a La component, and a Zr component is fired to produce primary fired powder that contains Li, La, Zr, and O for synthesis of a ceramic. Then, in the second firing process, the primary fired powder produced in the first firing process is fired to produce a synthetic ceramic that contains Li, La, Zr, and O and has a garnet-type or pseudo-garnet-type crystal structure. This readily provides ceramic powder or sintered body that has an LLZ crystal structure, and contains aluminum that produces handleable sintering properties (density) and conductivity.

(Li Component, La Component, and Zr Component)

These components each may be appropriately selected from metal oxides, metal hydroxides, metal carbonates, and other metal salts that contain the metal components described above. For example, the Li component may be $Li_2CO_3$ or LiOH, the La component may be $La(OH)_3$ or $La_2O_3$, and the Zr component may be $ZrO_2$. Oxygen is typically contained as an element constituting compounds containing these metal constituents. A raw material to produce the ceramic material can contain a Li component, a La component, and a Zr component to such an extent as to yield the LLZ crystal structure from the Li, La, and Zr components by, for example, a solid phase reaction. The Li, La, and Zr components in LLZ can have a stoichiometric ratio of 7:3:2 or similar to that. In consideration of loss of the Li component, the Li component may be contained in an approximately 10% excess amount to the stoichiometric ratio of Li in LLZ, and the La and Zr components each may be contained in an amount equivalent to the molar ratio of the component in LLZ. For example, these components may be contained in a molar ratio, Li:La:Zr, of 7.7:3:2. The molar ratio of a specific compound is approximately 3.85:3:2 for $Li_2CO_3:La(OH)_3:ZrO_2$, approximately 3.85:1.5:2 for $Li_2CO_3:La_2O_3:ZrO_2$, approximately 7.7:3:2 for $LiOH:La(OH)_3:ZrO_2$, or approximately 7.7:1.5:2 for $LiOH:La_2O_3:ZrO_2$. The raw material powder may be prepared by an appropriate known raw powder preparation process for synthesis of ceramic powder. For example, the raw materials may be homogeneously mixed with an automated mortar machine or an appropriate ball mill.

(First Firing Process)

In the first firing process, at least the Li and La components are pyrolyzed to produce primary fired powder for facilitating the formation of an LLZ crystal structure in the second firing process. The primary fired powder may preliminarily have an LLZ crystal structure. The firing temperature is preferably 850° C. or higher and 1150° C. or lower. The first firing process may include one or more low temperature heating steps and one or more high-temperature heating steps within the temperature range. These heating steps help to produce uniform ceramic powder and a high-quality sintered body in the second firing process. After each of these multiple heating steps, if performed in the first firing process, the fired product is preferably kneaded and ground with, for example, an automated mortar machine, a ball mill, or a vibration mill. Dry grinding is desirable. These steps help to yield a more uniform LLZ phase in the second firing process. The heating steps of the first firing process are preferably performed at 850° C. or higher and 950° C. or lower and at 1075° C. or higher and 1150° C. or lower. More preferably, the steps are performed at 875° C. or higher and 925° C. or lower (most preferably at approximately 900° C.) and at 1100° C. or higher and 1150° C. or lower (most preferably at approximately 1125° C.). In the first firing process, the total heating time at the maximum temperature determined as a heating temperature is preferably approximately 10 hours or more and 15 hours or less. If the first firing process includes two heating steps, the heating time at the maximum temperature is preferably in the range of approximately 5 to 6 hours in each step. A change of one or more components in the starting material can reduce the time required for the first firing process. For example, if LiOH is used as one component contained in the starting material, the time to heat the LLZ constituents containing Li, La, and Zr at the maximum temperature can be 10 hours or less in a heating step at 850° C. or higher and 950° C. or lower to yield an LLZ crystal structure. This is because LiOH used in the starting material forms a liquid phase at a low temperature and thus readily reacts with other components at a lower temperature.

(Second Firing Process)

In the second firing process, the primary fired powder produced in the first firing process is heated at 950° C. or higher and 1250° C. or lower. In the second firing process, the primary fired powder produced in the first firing process is fired to produce a final ceramic product that is a complex oxide having an LLZ crystal structure. To yield such an LLZ crystal structure, for example, the LLZ constituents containing Li, La, and Zr are heated at 1125° C. or higher and 1250° C. or lower. If $Li_2CO_3$ is used as a Li component, heating is preferably performed at 1125° C. or higher and 1250° C. or lower. A temperature lower than 1125° C. may prevent the formation of a single LLZ phase and causes low Li conductivity, and a temperature higher than 1250° C. may cause formation of a heterogeneous phase (such as $La_2Zr_2O_7$) and causes low Li conductivity and significant crystal growth which fail to maintain the strength as a solid electrolyte. More preferably, the heating temperature is in the range of approximately 1180 to 1230° C. A change of one or more components in the starting material allows the second firing process to be performed at a lower temperature. For example, if LiOH is used as a Li component in the starting material, the LLZ constituents containing Li, La, and Zr may be heated at 950° C. or higher and lower than 1125° C. to yield an LLZ crystal structure. This is because LiOH used in the starting material forms a liquid phase at a low temperature and thus readily reacts with other components at a lower temperature. In the second firing process, the heating time at the heating temperature is preferably 18 hours or more and 50 hours or less. A time less than 18 hours causes insufficient formation of the LLZ-based ceramic, and a time exceeding 50 hours may cause the material to readily react with the setter through embedding powder and causes significant crystal growth, thus failing to achieve strength required for the sample. More preferably, the heating time is at least 30 hours. The second firing process is preferably performed after the primary fired powder is pressed by a known pressing process into a green body having a desired three-dimensional shape (for example, such a shape and size as to be used as the solid electrolyte of the all-solid-state battery). The green body of the primary fired powder promotes a solid phase reaction and provides a sintered body. After the second firing process, the ceramic powder produced in the second firing process may be formed into a green body and then additionally fired at a temperature similar to the heating temperature in the second firing process. If the green body of the primary fired powder is fired to be sintered in the second firing process, the second firing process is preferably performed with the green body buried into the same powder. This reduces loss of Li and a variation in the composition between before and after the second firing process. The green body of the raw powder is typically placed on the raw powder and then buried into the raw powder. This reduces reaction with the setter. If necessary, the green body may be held with the setter through the embedding powder placed on both sides of the green body to prevent warpage of the sintered body during the firing. If the second firing process is performed at a lower temperature with LiOH used as a Li component, the green body of the primary fired powder can be sintered without being buried into the powder. This is because a lower temperature in the second firing process relatively reduces the loss of Li and reaction with the setter.

The above firing processes produce a solid electrolyte layer 16 having an LLZ crystal structure. The first firing process and/or second firing process may be performed in the presence of an aluminum (Al)-containing compound to produce a solid electrolyte layer that has a crystal structure and contains aluminum.

EXAMPLES

The present invention will now be described more in detail with reference to the following examples.

Example A1

An all-solid-state battery 10 having the configuration in FIG. 2 was produced. A positive-electrode active material sheet was produced as a positive-electrode active material 12 that had a layered rock-salt structure, a composition $Li(Ni_{1/3}Co_{1/3}Mn_{1/3})O_2$ (hereinafter referred to as NCM), and the (003) plane oriented in the direction from a positive electrode layer 14 toward a negative electrode layer 20. A positive-electrode active material sheet having a thickness of 30 μm was prepared. A solid electrolyte layer 16 was formed on the sheet positive-electrode active material 12. A ceramic material having a garnet-type crystal structure having a composition $Li_7La_3Zr_2O_{12}$ containing Al (hereinafter referred to as LLZ-Al) was used as a lithium-ion conductive material of the solid electrolyte layer 16. The solid electrolyte layer 16 was prepared to have a thickness of 10 μm. A negative-electrode active material 18 having a thickness of 10 μm was prepared with lithium metal. A positive-electrode collector 22 was prepared with aluminum foil having a thickness of 10 μm, and a negative-electrode collector 24 was prepared with copper foil having a thickness of 10 μm. A laminate of these components was produced as a unit cell. The unit cell was packaged by lamination with a multi-layer aluminum (AD/polypropylene (PP) composite sheet. The resultant all-solid-state battery had longitudinal and lateral dimensions of 20 mm and 30 mm, respectively, when viewed from above and a thickness of 0.24 mm.

The produced battery was tested at a charge and discharge mode before the calculation of volumetric-energy density. In the test, the battery was charged at a constant current of 1 mA, then charged at a constant voltage of 4.1 V, and thereafter discharged at a constant current of 1 mA until the voltage reached 3 V. The observed discharge capacity (mAh) was 20 mAh. Under assumption of an average discharge voltage of 3.9 V, the volumetric-energy density determined from the following formula (1) was 542 Wh/L:

$$(E \times C)/V \quad (1)$$

where E is a voltage (=3.9 V), C is a capacity (mAh), and V is a battery volume (cm³).

Example A2

The unit cells produced in Example A1 were stacked in parallel to produce a battery having a capacity of 100 mAh. The energy density calculated as in Example A1 was 650 Wh/L.

Example A3

The unit cells produced in Example A1 were stacked in parallel to produce a battery having a capacity of 300 mAh. The energy density calculated as in Example A1 was 750 Wh/L.

Example A4

The unit cell was produced in which the lithium-ion conductive material of a solid electrolyte layer 16 having a thickness of 5 μm was LiPON and the configuration other than that was the same as that in Example A1. The unit cell was packaged by lamination as in Example A1. The resultant all-solid-state battery had longitudinal and lateral dimensions of 20 mm and 30 mm, respectively, when viewed from above and a thickness of 0.24 mm. The resultant all-solid-state battery had a capacity of 20 mAh and a volumetric-energy density of 542 Wh/L by the same calculation as in Example A1.

Example A5

The unit cells produced in Example A4 were stacked in parallel to produce a battery having a capacity of 100 mAh. The energy density calculated as in Example A4 was 650 Wh/L.

Example A6

The unit cells produced in Example A4 were stacked in parallel to produce a battery having a capacity of 300 mAh. The energy density calculated as in Example A1 was 750 Wh/L.

Results

The dimensions and performance of the batteries produced in Examples A1 to A6 are summarized in Table 1.

TABLE 1

|  | Dimensions of battery (mm) | Capacity (mAh) | Voltage (V) | Energy density (Wh/L) |
|---|---|---|---|---|
| Example A1 | 20 × 30 × 0.24 | 20 | 3.9 | 542 |
| Example A2 | 20 × 30 × 1.0 | 100 | 3.9 | 650 |
| Example A3 | 20 × 30 × 2.6 | 300 | 3.9 | 750 |
| Example A4 | 20 × 30 × 0.24 | 20 | 3.9 | 542 |
| Example A5 | 20 × 30 × 1.0 | 100 | 3.9 | 650 |
| Example A6 | 20 × 30 × 2.6 | 300 | 3.9 | 750 |

The dimensions and performance of the batteries in Table 1 are very suitable for various applications including backup power sources for volatile memories in devices, such as computers. For reference, the dimensions and performance of the batteries determined, in private view of the applicant, to be desired in several applications including a backup power source for a volatile memory are summarized in Table 2. If used as a backup power source for a volatile memory, multiple all-solid-state batteries may be disposed on or in the vicinity of (for example, adjacent to) a substrate having the volatile memory mounted thereon and may be connected to the volatile memory in accordance with a required power supply time. It should be understood that the all-solid-state battery in accordance with the present invention is very favorable for various applications including the applications in Table 2. A parallel stack of unit cells achieves high capacity in an application requiring a significantly high capacity, such as an electric vehicle in Table 2.

TABLE 2

| Application | Dimensions of battery (mm) | Capacity (mAh) | Voltage (V) | Energy density (Wh/L) |
|---|---|---|---|---|
| Backup power source for volatile memory | 20 × 30 × 3 | 300 | 3.9 | over 600 |
| Smart card | 20 × 50 × 0.2 | 3 | 3.9 | 60 |
| Agricultural sensor (for measuring temperature/humidity) | 20 × 30 × 4 | 6-12 | 3.9 | 10-20 |
| Diagnosis of structure | 20 × 30 × 4 | 12-60 | 3.9 | 20-100 |
| Radiation monitor | 20 × 30 × 4 | 240 | 3.9 | 400 |
| Smartphone | 30 × 80 × 4 | 2000 | 3.9 | 600 |
| Electric vehicle | 100 × 200 × 40 | 50000 | 3.9 | over 600 |

Example B1

An example of the volatile memory backup system including an all-solid-state battery in accordance with the present invention used for an NVDIMM (nonvolatile memory module) will now be described. In this example, all the data in a DRAM is transferred within 30 minutes. The specifications of the NVDIMM, the operating conditions of the DRAM, and the specifications of the all-solid-state battery prerequisite to this example are as below:

<Prerequisite Specifications of NVDIMM>
Memory capacity: 4 GB
Memory configuration: 4Gbit DRAM with eight chips and 32Gbit flash memory with one chip
DIMM board size: 133.35 mm×24.00 mm (DDR3 standard)

<Operating Conditions for Collective Transfer of All Data from DRAM to Flash Memory (Active Mode)>
Voltage: 3.3 V
Current: 4 A (average), 7 A (peak)
Time: 34 seconds
Energy: 0.125 Wh (=3.3 V×4 A×34 seconds/3600)

<Operating Conditions for Idle Mode of DDR3>
Power for one DRAM chip: 0.55 W (Voltage: 3.3 V, Current: 0.167 A)

<Operating Conditions for Self-refresh Mode of DDR3>
Output: 37 mW for eight DRAM chips (Voltage: 3.3 V, Current: 0.011 A)
Output: 32 mW for seven DRAM chips (Voltage: 3.3 V, Current: 0.010 A)

Figure 3:
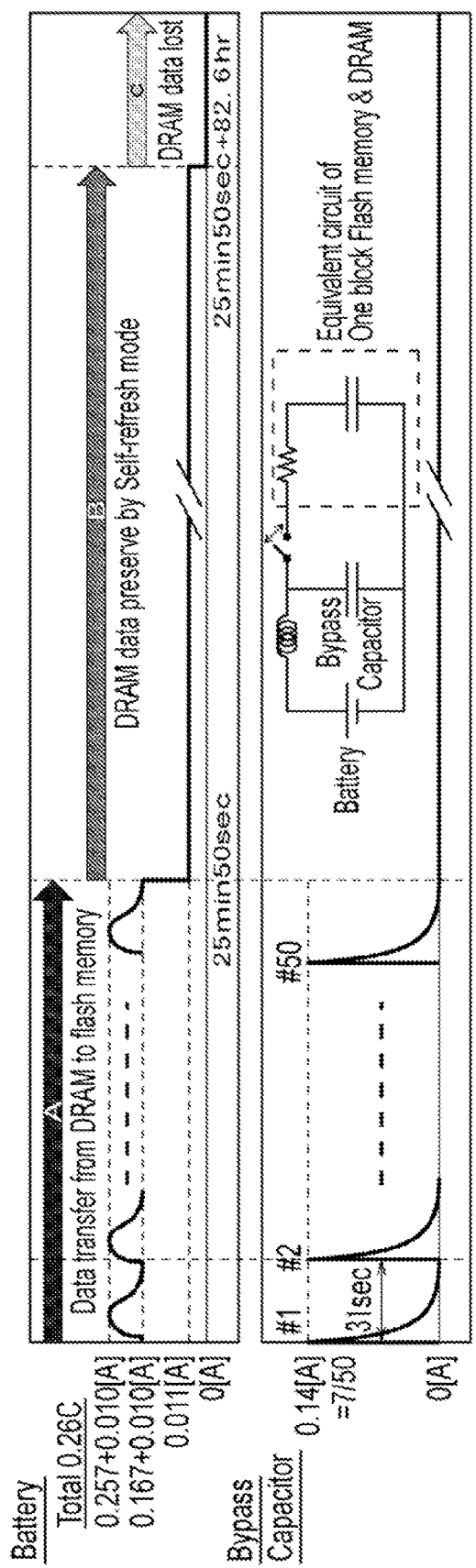
FIG. 3 illustrates example waveforms of output from the backup power source in the backup system in Example B1.

<Specifications of All-solid-state Battery>
Energy density: 400 Wh/L
Dimensions of battery: 20 mm×85 mm×5 mm
C-rate for use in data transfer: 0.25 C FIG. 3 illustrates waveforms of output from the backup power source in this example. As illustrated in FIG. 3, the backup system in this example takes approximately 25 minutes and 50 seconds to complete data transfer from the DRAM to the flash memory and then preserves the data in the DRAM operated in the self-refresh mode for approximately 82.6 hours. Thus, the data is completely duplicated to the flash memory, which is a nonvolatile memory, within a relatively short time of approximately 30 minutes in preparation for the energy depletion of the all-solid-state battery and is also preserved in the DRAM for at least approximately 82.6 hours after the duplication. Meanwhile, the power supply system is monitored for one second after the transfer of each data block (every 30 seconds) to check for the restoration of the power supply, thereby enabling instantaneous data restoration after the restoration of power supply.

Estimates of the conditions in this example are as below:
Available battery energy: 3.4 Wh (=400 Wh/L×2 cm×8.5 cm×0.5 cm/1000)
Current output from battery: 0.257 A (=3.4 Wh/3.3 V×(0.25 C/1.0 C))
Time taken for data transfer: 25 minutes (=(0.125 Wh/L)/ 3.3 V/0.09 A×60, 0.09 A=0.257 A−0.167 A)
The number of blocks of data transferred: 50 (=25 minutes/30 seconds. The transfer of one data block takes 30 seconds, which should be shorter than 34 seconds (the data transfer time in the specifications of the DRAM) to ensure the time for monitoring the power supply system.)
Monitoring of power supply system after transfer of one data block: 1 second (An interrupt signal from the power source can be received in this one second if the power supply is restored.)
Total data transfer time: 25 minutes and 50 seconds (=(30 seconds+1 second)×50=1550 seconds)
Total energy for data transfer: 0.365 Wh (=0.257 A×3.3 V×1550 seconds/3600)

Self-refresh time after data transfer: 82.6 hours (=(3.4 Wh−0.365 Wh)/0.037 W−1550/3600)

Example B2

Another example of the volatile memory backup system including an all-solid-state battery in accordance with the present invention used for an NVDIMM (nonvolatile memory module) will now be described. In this example, a battery smaller than that in Example B1 is used, and data is transferred from a DRAM to a flash memory over a longer time than in Example B1. The specifications of the NVDIMM, the operating conditions of the DRAM, and the specifications of the all-solid-state battery prerequisite to this example are as below:

<Prerequisite Specifications of NVDIMM>
Memory capacity: 4 GB
Memory configuration: 4 Gbit DRAM with eight chips and 32 Gbit flash memory with one chip
DIMM board size: 133.35 mm×24.00 mm (DDR3 standard)

<Operating Conditions for Collective Transfer of All Data from DRAM to Flash Memory (Active Mode)>
Voltage: 3.3 V
Current: 4 A (average), 7 A (peak)
Time: 34 seconds
Energy: 0.125 Wh (=3.3 V×4 A×34 seconds/3600)

<Operating Conditions for Idle Mode of DDR3>
Power for one DRAM chip: 0.55 W (Voltage: 3.3 V, Current: 0.167 A)

<Operating Conditions for Self-refresh Mode of DDR3>
Output: 37 mW for eight DRAM chips (Voltage: 3.3 V, Current: 0.011 A)
Output: 32 mW for seven DRAM chips (Voltage: 3.3 V, Current: 0.010 A)

Figure 4:
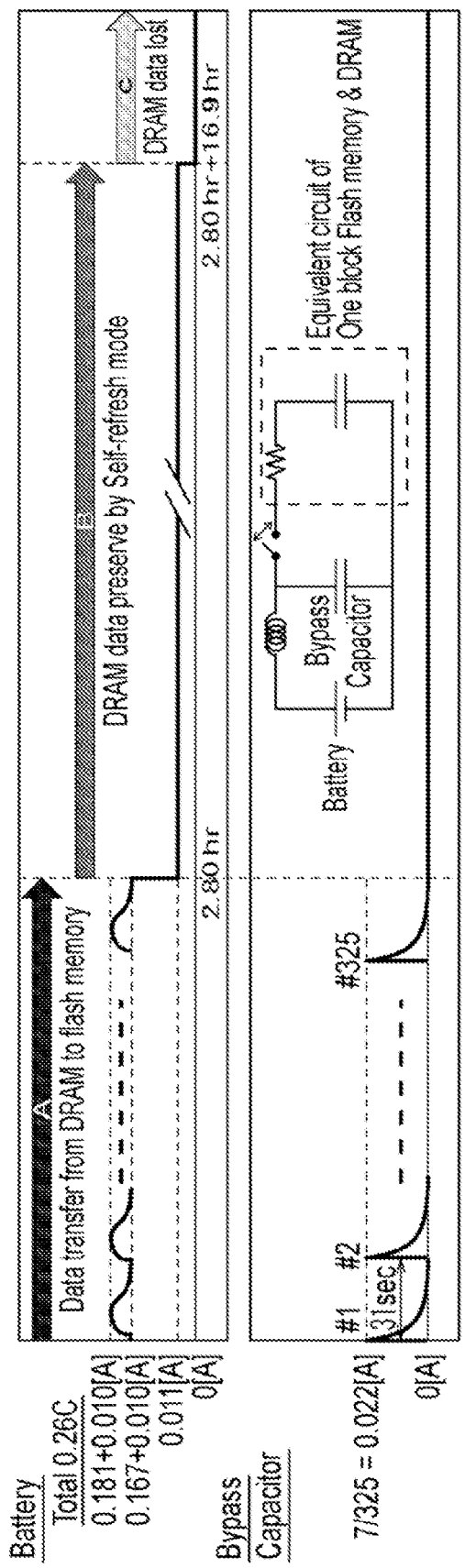
FIG. 4 illustrates example waveforms of output from the backup power source in the backup system in Example B2.

<Specifications of All-solid-state Battery>
Energy density: 400 Wh/L
Dimensions of battery: 20 mm×60 mm×5 mm
C-rate for use in data transfer: 0.25 C FIG. 4 illustrates waveforms of output from the backup power source in this example. As illustrated in FIG. 4, the backup system in this example takes approximately 2.80 hours to complete data transfer from the DRAM to the flash memory and then preserves the data in the DRAM operated in the self-refresh mode for approximately 16.9 hours. Thus, even with a relatively small all-solid-state battery, the data is completely duplicated to the flash memory, which is a nonvolatile memory, in approximately 2.80 hours in preparation for the energy depletion of the all-solid-state battery and is also preserved in the DRAM for approximately 16.9 hours after the duplication. Meanwhile, the power supply system is monitored for one second after the transfer of each data block (every 30 seconds) to check for the restoration of the power supply, thereby enabling instantaneous data restoration after the restoration of power supply.

Estimates of the conditions in this example are as below:
Available battery energy: 2.4 Wh (=400 Wh/L×2 cm×6 cm×0.5 cm/1000)
Current output from battery: 0.181 A (=2.4 Wh/3.3 V×(0.25 C/1.0 C))
Time taken for data transfer: 2.71 hours (=(0.125 Wh/L)/3.3 V/0.014 A, 0.014 A=0.181 A−0.167 A)
The number of blocks of data transferred: 325(=2.71 hours/30 seconds. The transfer of one data block takes 30 seconds, which should be shorter than 34 seconds (the data transfer time in the specifications of the DRAM) to ensure the time for monitoring the power supply system.)
Monitoring of power supply system after transfer of one data block: 1 second (An interrupt signal from the power source can be received in this one second if the power supply is restored.)
Total data transfer time: 2.80 hours (=(30 seconds+1 second)×325)=10075 seconds)
Total energy for data transfer: 1.67 Wh (=0.181 A×3.3 V×10075 seconds/3600)
Self-refresh time after data transfer: 16.9 hours (=(2.4 Wh−1.67 Wh)/0.037 W−2.80)

Example C1 (Reference)

An example all-solid-state battery used to back up a dual inline memory module (DIMM), which is a volatile memory, will now be described. This example is not about a backup system combined with a nonvolatile memory but a preferred modification of the volatile memory backup system including an all-solid-state battery, which will be described as a reference. The specifications of the DIMM and the all-solid-state battery prerequisite to this example are as below:

<Prerequisite Specifications of DIMM>
DDR3 8 GB DIMM (M393B1G70QH0-YH9/K0 manufactured by Samsung Electronics)
Voltage: 1.35 V
Self-refresh current: 0.3 A <Specifications of All-solid-state Battery>
Energy density: 400 Wh/L
Dimensions of battery: 20 mm×60 mm×5 mm
C-rate for use in data transfer: 0.25 C The backup system in this example operates the DIMM connected to the all-solid-state battery in the self-refresh mode by a current supplied from the all-solid-state battery. Estimates of the conditions in this example are as below:
Available battery energy: 2.4 Wh (=400 Wh/L×2 cm×6 cm×0.5 cm/1000)
Current output from battery: 0.444 A (=2.4 Wh/1.35 V×(0.25 C/1.0 C)) (The current value can be used as a current (0.3 A) in the self-refresh mode.)
Total backup time: 5.92 hours (=(2.4 Wh/(1.35 V×0.3 A))

The backup system in this example preserves the data in the DIMM for 5.92 hours, as described above. Statistics indicate that 95% of the power failures are restored within four hours. In view of the statistics, the backup system in this example, which takes 5.92 hours as a total backup time, can cope with most (95% or more) of the power failures despite a significantly simple configuration without a nonvolatile memory.

Example C2 (Reference)

An example backup system that has the same configuration as in Example C1 other than a DIMM having specifications different from that in Example C1 will now be described. The DIMM in this example consumes less power than the DIMM in Example C1. This example is also not about a backup system combined with a nonvolatile memory but a preferred modification of the volatile memory backup system including an all-solid-state battery, which will be described as a reference. The specifications of the DIMM and the all-solid-state battery prerequisite to this example are as below:

<Prerequisite Specifications of DIMM>
DDR4 8GB DIMM (MTA18ASF1G72PZ-8GB manufactured by Micron Technology, Inc.)
Voltage: 1.2 V
Self-refresh current: 0.18 A
<Specifications of All-solid-state Battery>
Energy density: 400 Wh/L
Dimensions of battery: 20 mm×60 mm×2.5 mm
C-rate for use in data transfer: 0.25 C
Estimates of the conditions in this example are as below:
Available battery energy: 1.2 Wh (=400 Wh/L×2 cm×6 cm×0.25 cm/1000)
Current output from battery: 0.25 A (=1.2 Wh/1.2 V×(0.25 C/1.0 C)) (The current value can be used as a current (0.18 A) in the self-refresh mode.)
Total backup time: 5.56 hours (=(1.2 Wh/(1.2 V×0.18 A))

The backup system in this example preserves the data in the DIMM for 5.56 hours, as described above. Statistics indicate that 95% of the power failures are restored within four hours. In view of the statistics, the backup system in this example, which takes 5.56 hours as a total backup time, can cope with most (95% or more) of the power failures despite a significantly simple configuration without a nonvolatile memory.

Example C3

Another example of the volatile memory backup system including an all-solid-state battery in accordance with the present invention used for an NVDIMM (nonvolatile memory module) will now be described. In this example, the all-solid-state battery is switched on and off to make a clear distinction between the roles of the all-solid-state battery and a bypass capacitor. The specifications of the NVDIMM, the operating conditions of the DRAM, and the specifications of the all-solid-state battery prerequisite to this example are as below:

<Prerequisite Specifications of NVDIMM>
NVDIMM (8GB DDR3) (NV3848HAT17-000NL000 manufactured by Netlist)
Memory capacity: 8 GB
Memory configuration: 4 Gbit DDR3 DRAM with eighteen chips and 32 Gbit NAND flash memory with two chips
DIMM board size: 133.35 mm×24.00 mm (DDR3 standard)
<Operating Conditions for Transferring Data from DRAM to Flash Memory with Supercapacitor (*)>
Voltage: 5.4 V (series connection of 2.7 V capacitors)
Current: 2.5 A
Time: 34 seconds
Energy: 0.128 Wh (=5.4 V×2.5 A×34 seconds/3600) (a value calculated in the case of a supercapacitor)
The above values are based on the prerequisite specifications of a supercapacitor, and an all-solid-state battery is used in this example instead of the supercapacitor.
<Operating Conditions for Self-refresh Mode of DDR3 (with Eighteen Chips)>
Voltage: 1.35 V
Current: 0.3 A
<Specifications of All-Solid-State Battery>
Energy density: 400 Wh/L
Dimensions of battery: 20 mm×80 mm×4 mm
C-rate for use in data transfer: 0.25 C <Equivalent Circuit>

Figure 5:
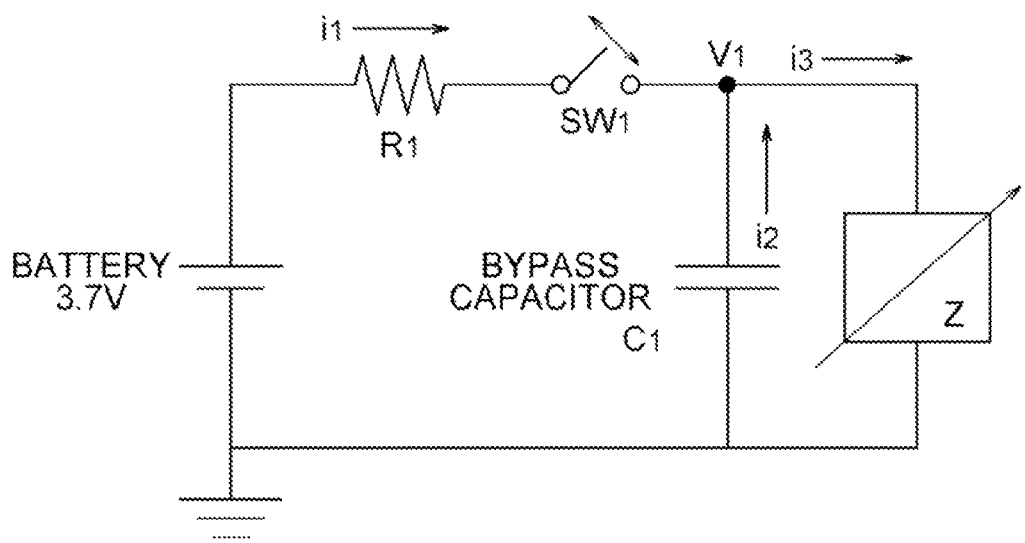

FIG. 5 illustrates an equivalent circuit achieving a hybrid operation that is a combination of data transfer from the DRAM to the flash memory and preservation in the DRAM in the self-refresh mode under the above-described prerequisites. Major reference characters used in the equivalent circuit diagram in FIG. 5 are as follows:

$R_1$: a resistor for reducing a peak output current from the all-solid-state battery (which may be an inductor)

$C_1$: a bypass capacitor for applying a current for data transfer from the DRAM to the flash memory Z: an equivalent impedance (variable) of the DRAM and the flash memory (including 3.7/3.3 and 3.7/1.35 DC/DC converters)

$i_3$: (i) a current of 3.6 A during data transfer from the DRAM to the flash memory (Voltage: 3.7 V) (Reference: a current of 2.5 A in the case of a supercapacitor (Voltage: 5.4 V)),
(ii) a current of 0.11 A in the self-refresh mode of the DRAM without access to the flash memory (Voltage: 3.7 V) (Reference: a current of 0.3 A in the case of the DDR3 8 GB DIMM used in Example C1 (Voltage: 1.35 V))

<Power Output Waveform>

Figure 6:
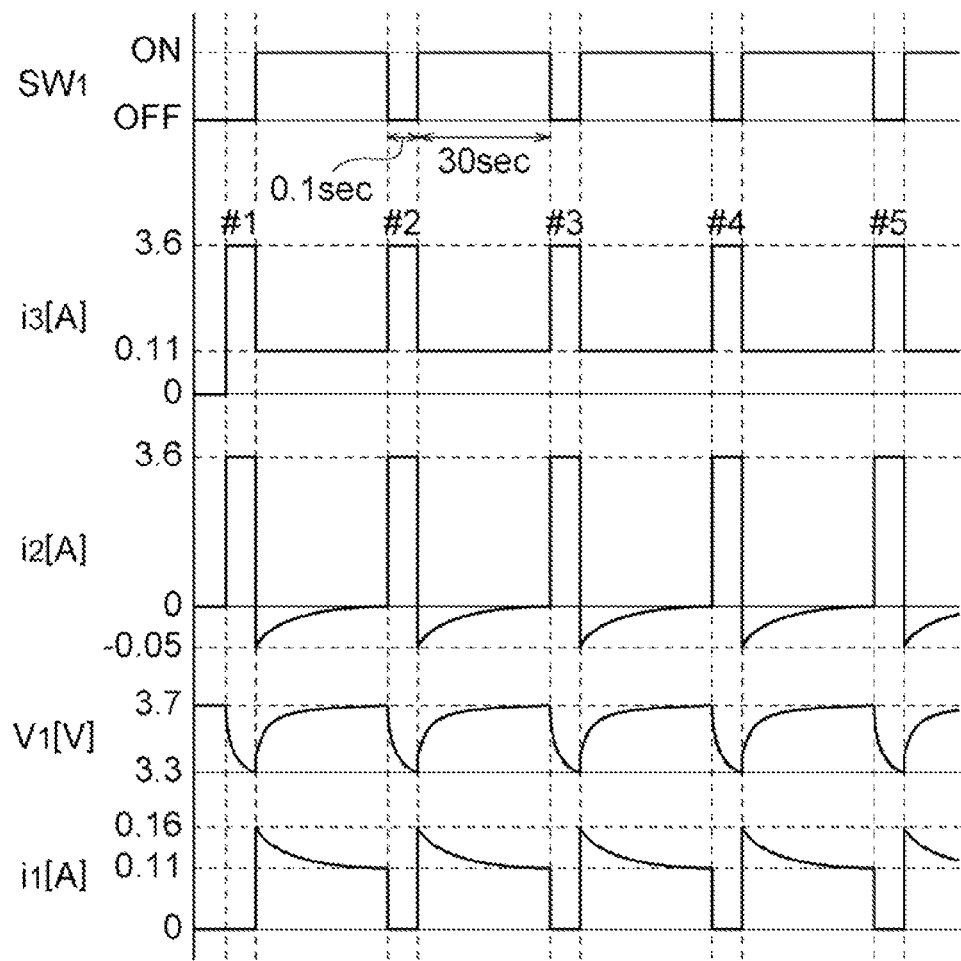

FIG. 6 illustrates waveforms of output from the backup power source in this example, observed under the prerequisites in the equivalent circuit in FIG. 5. As illustrated in FIG. 6, the backup system in this example transfers a divided volume of data from the DRAM to the flash memory by a peak current supplied to the circuit for 0.1 second by the bypass capacitor and turns off the switch $SW_1$ in the meantime; thus, the all-solid-state battery does not supply a current. The backup system then turns on the switch $SW_1$ to supply a current from the all-solid-state battery to the circuit for 30 seconds and charges the bypass capacitor while preserving the data in the DRAM operated in the self-refresh mode. After the bypass capacitor is completely charged in the 30 seconds, the switch $SW_1$ is turned off again, and the data transfer from the DRAM to the flash memory (for 0.1 second) and the operation in the self-refresh mode (for 30 seconds) are alternately repeated.

Estimates of the conditions in this example are as below:
(Designed Parameters)
The data transfer time, i.e., 34 seconds, is divided into 340 steps. (34 seconds=0.1 second×340 steps)
The time to charge the bypass capacitor with the battery is 30 seconds.
Charge required in one step: 0.36 C (=3.6 A×0.1 second)
Minimum static capacitance $C_1$: 0.9 F (=0.36 C/(3.7 V−3.3 V)
(For example, an electric double-layer capacitor (EDLC) manufactured by Murata Manufacturing Co., Ltd. has dimensions of 14 mm×30 mm×3.7 mm with a capacitance of 1 F.)
Resistance $R_1$: 8.3Ω (The value of $R_1$ is determined from the following formula:)

$$30 \text{ seconds} = 4 \times (\text{Time constant})(\text{time for } V_1 \text{ to restore 99\%})$$
$$= 4 \times 0.9F \times R_1$$

Maximum value of $i_1$: 0.16 A (=(3.7 V−3.3 V)/8.3Ω+0.11 A)
Total energy required for battery: 1.42 Wh(=(0.16 A+0.11 A)/2)×(30 seconds/3600)×3.7 V×340 steps (Application of Battery)

Available battery energy: 2.56 Wh (=400 Wh/L×2 cm×8 cm×0.4 cm/1000) (This value should be larger than the total energy required for the battery, i.e., 1.42 Wh.)

Peak current output from battery: 0.173 A (=2.56 Wh/3.7 V×0.25 (where 0.25 is a C-rate.)

(The current value should be larger than 0.16 A.)

Total data transfer time: 2.8 hours (=(0.1 second+30 seconds)×340 steps/3600)

DRAM preservation time after data transfer: 2.8 hours (Remaining battery energy: 1.14 WH=2.56−1.42 Wh, 2.8 hours =1.14 Wh/(3.7 V×0.11 A), in the self-refresh mode)

Total DRAM preservation time: 5.6 hours (=2.8 hours (Total data transfer time)+2.8 hours (DRAM preservation time after data transfer))

As described above, the backup system in this example takes 2.8 hours to transfer the data in the DRAM to the flash memory and then preserves the data in the DRAM operated in the self-refresh mode for 2.8 hours. Thus, the data is completely duplicated to the flash memory, which is a nonvolatile memory, in 2.8 hours in preparation for the energy depletion of the all-solid-state battery and is also preserved in the DRAM for 2.8 hours. In view of statistics indicating that 95% of the power failures are restored within four hours, the backup system in this example, which takes 5.6 hours as a total DRAM preservation time, can cope with most (95% or more) of the power failures with the DRAM. The system can be restored with the data already duplicated to the flash memory even after the lapse of 5.6 hours. This indicates that the loss of the data can be effectively prevented regardless of the time taken until the restoration of power supply.

What is claimed is:

1. A volatile memory backup system including an all-solid-state battery, comprising:
   a volatile memory;
   a nonvolatile memory connected to the volatile memory so as to transfer data therebetween;
   an all-solid-state battery connected to the volatile memory and the nonvolatile memory, the all-solid-state battery continuously or intermittently supplying a current to the volatile memory in the event of a power failure to retain data in the volatile memory; and
   a controller connected in parallel with the all-solid-state battery, the controller intermittently supplying a peak current to the volatile memory in the event of the power failure and intermittently transferring divided volumes of data in the volatile memory to the nonvolatile memory by the peak current or by the peak current and a current from the all-solid-state battery temporarily increased in association with the peak current to store the data in the nonvolatile memory, thereby gradually accumulating the data in the volatile memory into the nonvolatile memory.

2. The volatile memory backup system according to claim 1, wherein the volatile memory is a DRAM, and the nonvolatile memory is a flash memory.

3. The volatile memory backup system according to claim 1, wherein the controller supplies the peak current from a parasitic capacitance of a circuit, component, and/or device connected with the backup system.

4. The volatile memory backup system according to claim 1, wherein the controller comprises a bypass capacitor that supplies the peak current.

5. The volatile memory backup system according to claim 1, wherein a total sum of the peak current and the current from the all-solid-state battery temporarily increased in association with the peak current is attenuated periodically, so that the data transfer from the volatile memory to the nonvolatile memory is intermittently suspended and the volatile memory operates in a power-saving mode using the current supplied from the all-solid-state battery in the meantime.

6. The volatile memory backup system according to claim 1, wherein the volatile memory and the nonvolatile memory are mounted on at least one substrate.

7. The volatile memory backup system according to claim 6, wherein the all-solid-state battery is disposed on or in the vicinity of the substrate.

8. The volatile memory backup system according to claim 1, wherein the all-solid-state battery is disposed in the vicinity of the volatile memory and the nonvolatile memory.

9. The volatile memory backup system according to claim 1, installed in at least one device selected from the group consisting of a computer, a laptop computer, a portable computer, a pocket computer, a workstation, a supercomputer, computer-peripheral hardware, and a server.

10. The volatile memory backup system according to claim 1, wherein the all-solid-state battery comprises:
    a positive electrode layer comprising a positive-electrode active material that is an oriented polycrystalline body composed of lithium transition metal oxide grains oriented in a given direction;
    a solid electrolyte layer composed of a lithium-ion conductive material; and
    a negative electrode layer comprising a negative-electrode active material.

11. The volatile memory backup system according to claim 10, wherein the all-solid-state battery has an energy density of 700 Wh/L or higher, a thickness of 5 mm or less, and each of longitudinal and lateral dimensions of 100 mm or less.

12. The volatile memory backup system according to claim 10, wherein the all-solid-state battery has an energy density of 600 Wh/L or higher, a thickness of 2 mm or less, and each of longitudinal and lateral dimensions of 50 mm or less.

13. The volatile memory backup system according to claim 10, wherein the all-solid-state battery has an energy density of 500 Wh/L or higher, a thickness of 1 mm or less, and each of longitudinal and lateral dimensions of 50 mm or less.

14. The volatile memory backup system according to claim 10, wherein the all-solid-state battery has an energy density of 250 Wh/L or higher, a thickness of 0.5 mm or less, and each of longitudinal and lateral dimensions of 50 mm or less.

15. The volatile memory backup system according to claim 10, wherein the all-solid-state battery has an energy density of 100 Wh/L or higher, a thickness of 0.3 mm or less, and each of longitudinal and lateral dimensions of 50 mm or less.

16. The volatile memory backup system according to claim 10, wherein the all-solid-state battery has an energy density of 100 to 1,000 Wh/L, a thickness of 0.1 to 10 mm, and each of longitudinal and lateral dimensions of 5 to 100 mm.

17. The volatile memory backup system according to claim 10, wherein the all-solid-state battery has an energy density of 250 to 700 Wh/L, a thickness of 0.3 to 5 mm, and each of longitudinal and lateral dimensions of 10 to 50 mm.

18. The volatile memory backup system according to one of claim 10, wherein the oriented polycrystalline body of the positive-electrode active material has a thickness of at least 5 µm.

19. The volatile memory backup system according to claim 10, wherein the oriented polycrystalline body of the positive-electrode active material has a thickness of at least 10 µm.

20. The volatile memory backup system according to claim 10, wherein the oriented polycrystalline body of the positive-electrode active material has a thickness of at least 25 µm.

21. The volatile memory backup system according to claim 10, wherein the given direction is a direction of lithium-ion conduction.

22. The volatile memory backup system according to claim 21, wherein the given direction is a direction from the positive electrode layer toward the negative electrode layer.

23. The volatile memory backup system according to claim 10, wherein a specific crystal face of each grain in the positive-electrode active material is oriented in the direction from the positive electrode layer toward the negative electrode layer.

24. The volatile memory backup system according to claim 10, wherein the grains contained in the positive-electrode active material have a layered rock-salt structure or a spinel structure.

25. The volatile memory backup system according to claim 10, wherein the grains contained in the positive-electrode active material have a layered rock-salt structure.

26. The volatile memory backup system according to claim 10, wherein the grains contained in the positive-electrode active material have a composition represented by $Li_xM1O_2$ or $Li_x(M1,M2)O_2$ where $0.5<x<1.10$, M1 is at least one transition metal element selected from the group consisting of Ni, Mn, and Co, and M2 is at least one element selected from the group consisting of Mg, Al, Si, Ca, Ti, V, Cr, Fe, Cu, Zn, Ga, Ge, Sr, Y, Zr, Nb, Mo, Ag, Sn, Sb, Te, Ba, and Bi.

27. The volatile memory backup system according to claim 26, wherein the composition is represented by $Li_x(M1,M2)O_2$ where M1 is Ni and Co, and M2 is at least one element selected from the group consisting of Mg, Al, and Zr.

28. The volatile memory backup system according to claim 26, wherein the composition is represented by $Li_xM1O_2$ where M1 is Ni, Mn, and Co, or M1 is Co.

29. The volatile memory backup system according to claim 23, wherein the grains contained in the positive-electrode active material have a composition represented by $Li_p(Ni_x,Co_y,Al_z)O_2$ where $0.9 \le p \le 1.3$, $0.6<x<0.9$, $0.1<y\le0.3$, $00.2$, and $x+y+z=1$ and have a layered rock-salt structure, and the specific crystal face is a (003) plane.

30. The volatile memory backup system according to claim 10, wherein the lithium-ion conductive material of the solid electrolyte layer is a garnet-based ceramic material, a nitride-based ceramic material, a perovskite-based ceramic material, a phosphate-based ceramic material, a sulfide-based ceramic material, or a polymer-based material.

31. The volatile memory backup system according to claim 30, wherein the lithium-ion conductive material of the solid electrolyte layer is a garnet-based ceramic material that has a garnet-type or pseudo-garnet-type crystal structure containing at least Li, La, Zr, and O.

32. The volatile memory backup system according to claim 31, wherein the garnet-type or pseudo-garnet-type crystal structure further contains Nb and/or Ta.

33. The volatile memory backup system according to claim 31, wherein the garnet-based ceramic material further contains Al.

34. The volatile memory backup system according to claim 10, wherein the positive electrode layer comprises the positive-electrode active material and a positive-electrode collector disposed on a face, remote from the solid electrolyte layer, of the positive-electrode active material, and the negative electrode layer comprises the negative-electrode active material and a negative-electrode collector disposed on a face, remote from the solid electrolyte layer, of the negative-electrode active material.

* * * * *